(12) United States Patent
Baek

(10) Patent No.: US 12,362,313 B2
(45) Date of Patent: Jul. 15, 2025

(54) SEMICONDUCTOR PACKAGE WITH BALANCED WIRING STRUCTURE

(71) Applicant: Samsung Electronics Co., Ltd., Suwon-si (KR)

(72) Inventor: Kiwon Baek, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 141 days.

(21) Appl. No.: 17/674,204

(22) Filed: Feb. 17, 2022

(65) Prior Publication Data
US 2023/0009850 A1    Jan. 12, 2023

(30) Foreign Application Priority Data
Jul. 9, 2021  (KR) .......................... 10-2021-0090487

(51) Int. Cl.
*H01L 23/00* (2006.01)
*H01L 25/065* (2023.01)

(52) U.S. Cl.
CPC .............. *H01L 24/48* (2013.01); *H01L 24/08* (2013.01); *H01L 25/0657* (2013.01); *H01L 2224/08145* (2013.01); *H01L 2224/48227* (2013.01)

(58) Field of Classification Search
CPC . H01L 2224/49051; H01L 2224/49052; H01L 2224/49096; H01L 2224/49097;
(Continued)

(56) References Cited

U.S. PATENT DOCUMENTS 6,531,784 B1 * 3/2003 Shim ...................... H01L 24/48
                                                      257/784
7,122,892 B2   10/2006 Fratti
(Continued)

FOREIGN PATENT DOCUMENTS

EP          3800665 A1 *  4/2021  ............. H01L 23/31
KR    10-2017-0105493 A   9/2017
KR    10-2018-0056317 A   5/2018

OTHER PUBLICATIONS

Korean Office Action dated May 29, 2025 issued in Korean Patent Application No. 10-2021-0090487.

*Primary Examiner* — Shaun M Campbell
*Assistant Examiner* — Teresa M. Arroyo
(74) *Attorney, Agent, or Firm* — Harness, Dickey & Pierce, P.L.C.

(57) ABSTRACT

Provided is a semiconductor package having improved signal integrity (SI) and a chip stack structure of a plurality of semiconductor chips. The semiconductor package includes a package substrate, a chip stack structure on the package substrate and including at least two semiconductor chips, and an external connection terminal on a lower surface of the package substrate. A first semiconductor chip arranged uppermost in the chip stack structure is connected to a first bonding pad of the package substrate through a first wire. A second semiconductor chip arranged under the first semiconductor chip in the chip stack structure is connected to a second bonding pad of the package substrate through a second wire. When the first bonding pad is farther from the external connection terminal than the second bonding pad, the external connection terminal is connected to the first bonding pad through a wiring line of the package substrate.

20 Claims, 20 Drawing Sheets

(58) Field of Classification Search
CPC . H01L 2224/73265; H01L 2224/83191; H01L 2224/08145; H01L 2224/48227; H01L 2224/05569; H01L 2224/16225; H01L 2225/0651; H01L 2225/06517; H01L 2225/06527; H01L 2225/06562; H01L 2225/06565; H01L 2924/00014; H01L 2924/15192; H01L 2924/15311; H01L 2924/301; H01L 2924/386; H01L 24/48; H01L 24/08; H01L 24/16; H01L 24/32; H01L 24/73; H01L 24/83; H01L 24/85; H01L 24/05; H01L 24/49; H01L 25/0657; H01L 25/0652; H01L 23/49816; H01L 23/5383; H01L 23/482; H01L 2224/48091; H01L 2224/16227; H01L 2224/73204; H01L 2224/0233; H01L 2224/73215; H01L 2224/0237; H01L 2224/02373; H01L 2224/8592; H01L 2224/32145; H01L 2224/32225; H01L 2224/48011; H01L 2224/023; H01L 2224/13008; H01L 2224/13024
See application file for complete search history.

(56) References Cited

U.S. PATENT DOCUMENTS

| | | |
|---|---|---|
| 9,980,366 B2 | 5/2018 | Subramanian |
| 10,134,713 B2 | 11/2018 | Kim et al. |
| 10,461,033 B2 | 10/2019 | Lee et al. |
| 10,643,676 B2 | 5/2020 | Mobin et al. |
| 10,929,024 B2 | 2/2021 | Park |
| 2002/0027295 A1* | 3/2002 | Kikuma ............... H01L 23/3121 257/E23.125 |
| 2004/0229401 A1* | 11/2004 | Bolken ................. H01L 21/565 438/109 |
| 2006/0091518 A1* | 5/2006 | Grafe .................. H01L 25/0657 257/E23.07 |
| 2006/0249829 A1* | 11/2006 | Katagiri ................ H01L 24/50 257/E25.013 |
| 2008/0067658 A1* | 3/2008 | Cablao ............... H01L 23/3128 257/777 |
| 2009/0321912 A1* | 12/2009 | Watanabe ........... H01L 25/0657 257/E23.116 |
| 2012/0086125 A1* | 4/2012 | Kang .................... H01L 23/481 257/737 |
| 2014/0175638 A1* | 6/2014 | Kim .................... H01L 29/0657 257/737 |
| 2015/0014862 A1* | 1/2015 | Kwon ................. H01L 23/3128 257/775 |
| 2015/0332986 A1* | 11/2015 | Tomohiro ........... H01L 25/0652 257/737 |
| 2021/0090612 A1* | 3/2021 | Park ........................ G11C 5/06 |
| 2021/0104496 A1* | 4/2021 | Hong ................ H01L 23/49816 |
| 2021/0202444 A1* | 7/2021 | Su ....................... H01L 25/0652 |
| 2021/0249382 A1* | 8/2021 | Jeong ..................... H01L 24/32 |

* cited by examiner

SEMICONDUCTOR PACKAGE WITH BALANCED WIRING STRUCTURE

CROSS-REFERENCE TO RELATED APPLICATION

This application is based on and claims priority under 35 U. S. C. § 119 to Korean Patent Application No. 10-2021-0090487, filed on Jul. 9, 2021, in the Korean Intellectual Property Office, the disclosure of which is incorporated by reference herein in its entirety.

BACKGROUND

The inventive concepts relate to semiconductor packages, and more particularly, to semiconductor packages including a chip stack structure of a plurality of semiconductor chips mounted on a package substrate.

In accordance with the breakthrough of the electronics industry and user needs, electronic devices are becoming smaller and lighter. As the electronic devices are becoming smaller and lighter, semiconductor packages used therefor are becoming smaller and lighter. In addition, the semiconductor packages are required to have high performance, reliability and large capacities. For example, in relation to the reliability of a semiconductor package, as the semiconductor package becomes smaller and an operation speed thereof increases, signal integrity (SI) deteriorates due to noise. Therefore, research and development on a package structure capable of preventing the SI from deteriorating are being continuously performed.

SUMMARY

The inventive concepts relate to semiconductor packages having improved signal integrity (SI) and a chip stack structure of a plurality of semiconductor chips.

Further, objects of the inventive concepts are not limited thereto, and other objects may be clearly understood by those skilled in the art from the following description.

According to an aspect of the inventive concepts, a semiconductor package includes a package substrate, a chip stack structure on an upper surface of the package substrate, the chip stack structure including at least two semiconductor chips, and an external connection terminal on a lower surface of the package substrate. The at least two semiconductor chips include a first semiconductor chip and a second semiconductor chip. The first semiconductor chip is an uppermost one from among the at least two semiconductor chips and is connected to a first bonding pad of the package substrate through a first wire. The second semiconductor chip is under the first semiconductor chip from among the at least two semiconductor chips and is connected to a second bonding pad of the package substrate through a second wire. The first bonding pad is farther from the external connection terminal than the second bonding pad, and the external connection terminal is connected to the first bonding pad through a wiring line of the package substrate to configure a balanced wiring structure.

According to an aspect of the inventive concepts, a semiconductor package includes a package substrate, a chip stack structure on the package substrate and including at least two semiconductor chips, and at least one internal semiconductor chip apart from the chip stack structure and being on the package substrate. The at least two semiconductor chips include a first semiconductor chip and a second semiconductor chip. The first semiconductor chip is an uppermost one from among the at least two semiconductor chips and is connected to a first bonding pad of the package substrate through a first wire. The second semiconductor chip is under the first semiconductor chip from among the at least two semiconductor chips and is connected to a second bonding pad of the package substrate through a second wire. The internal semiconductor chip is connected to a signal pad of the package substrate through a wire or a bump. The first bonding pad is farther from the signal pad than the second bonding pad, and the signal pad is connected to the first bonding pad through a wiring line of the package substrate to configure a balanced wiring structure.

According to an aspect of the inventive concepts, a semiconductor package includes a package substrate, a chip stack structure on the package substrate and including at least two semiconductor chips, at least one internal semiconductor chip apart from the chip stack structure and being on the package substrate, and an external connection terminal on a lower surface of the package substrate. The at least two semiconductor chips include a first semiconductor chip and a second semiconductor chip. The first semiconductor chip is an uppermost one from among the at least two semiconductor chips and is connected to a first bonding pad of the package substrate through a first wire. The second semiconductor chip is under the first semiconductor chip from among the at least two semiconductor chips and is connected to a second bonding pad of the package substrate through a second wire. The first bonding pad is farther from the external connection terminal than the second bonding pad, and the external connection terminal is connected to the first bonding pad through a wiring line of the package substrate to configure a balanced wiring structure.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1A:
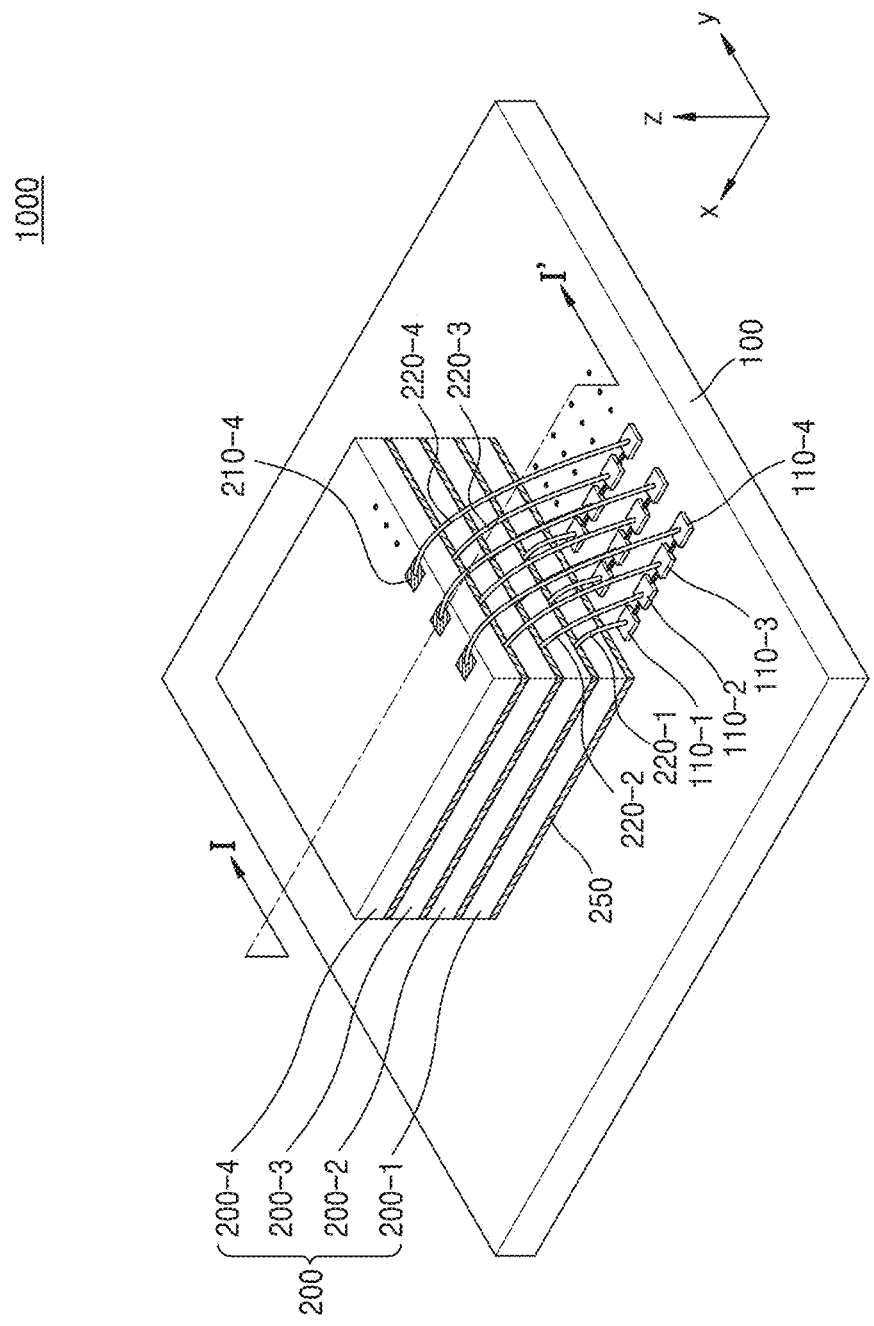
FIGS. 1A and 1B are a perspective view and a cross-sectional view of a semiconductor package having a balanced wiring structure according to an example embodiment of the inventive concepts.

Some example embodiments of the inventive concepts will be described in detail with reference to the accompanying drawings. Like reference numerals refer to like elements throughout and description thereof will not be given.

Figure 1B:
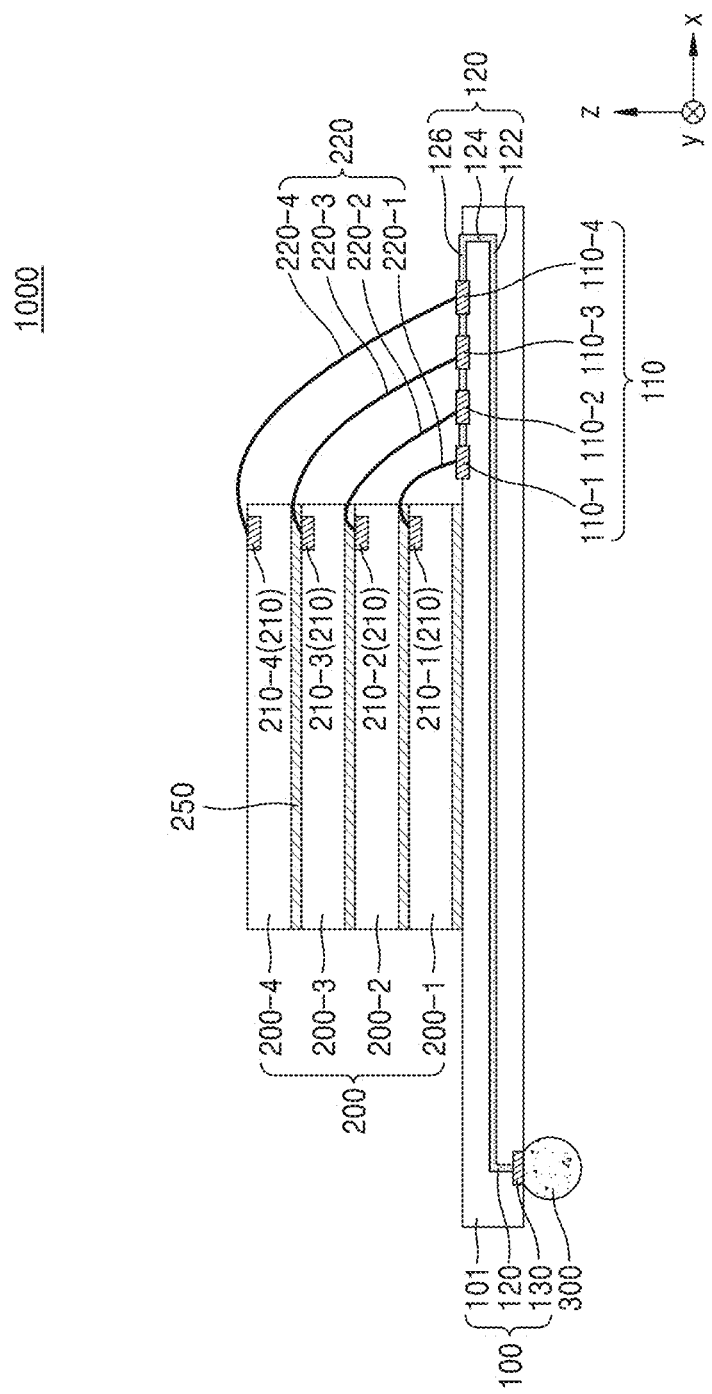
Figure 1C:
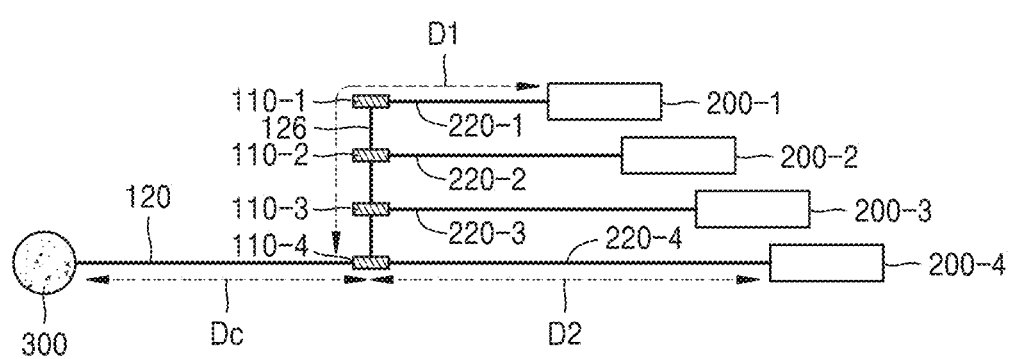
FIG. 1C is a conceptual diagram illustrating the balanced wiring structure in the semiconductor package of FIG. 1A.

FIGS. 1A and 1B are a perspective view and a cross-sectional view of a semiconductor package 1000 having a balanced wiring structure according to an example embodiment of the inventive concepts, and FIG. 1C is a conceptual diagram illustrating the balanced wiring structure in the semiconductor package of FIG. 1A.

Referring to FIGS. 1A and 1B, the semiconductor package 1000 having a balanced wiring structure (hereinafter, simply referred to as a 'semiconductor package') according to the current example embodiment may include a package substrate 100, a chip stack structure 200, and an external connection terminal 300. The package substrate 100 may include a body layer 101, a bonding pad 110, a wiring line 120, and an external pad 130.

The body layer 101 may include one of various materials. For example, the body layer 101 may include silicon (Si), ceramic, an organic material, glass, or epoxy resin in accordance with a kind of the package substrate 100. In the semiconductor package 1000 according to an example embodiment, the package substrate 100 may include a printed circuit board (PCB) and the body layer 101 may be based on epoxy resin. The body layer 101 may include a single layer or a multilayer to correspond to the wiring line 120. For example, when the wiring line 120 is arranged in the body layer 101, the body layer 101 may include one more layer than that of the wiring line 120 arranged therein. However, according to an example embodiment, when the wiring line 120 is not arranged in the body layer 101 and is formed only on an upper surface and/or a lower surface of the body layer 101, the body layer 101 may include a single layer.

Although not shown, a protective layer may be arranged on the lower surface and the upper surface of the body layer 101. The protective layer may cover and protect the wiring line 120 arranged on the upper surface and the lower surface of the body layer 101. The protective layer may include, for example, solder resist (SR). However, a material of the protective layer is not limited to SR. For example, in accordance with a kind or function of a substrate, the protective layer may include a passivation layer such as an oxide layer or a nitride layer. On the other hand, the bonding pad 110 on the upper surface of the body layer 101 and the external pad 130 on the lower surface of the body layer 101 may be exposed from the protective layer. Furthermore, the body layer 101 may occupy most of the package substrate 100 and may be substantially the same as the package substrate 100. Therefore, hereinafter, the body layer 101 and the package substrate 100 may mean the same object.

The bonding pad 110 may be arranged on an upper surface of the package substrate 100 and may be electrically connected to first to fourth chip pads 210-1 to 210-4 of corresponding semiconductor chips of the chip stack structure 200 through first to fourth wires 220-1 to 220-4. The bonding pad 110 may include different numbers of bonding pads according to the number of stacked semiconductor chips of the chip stack structure 200. For example, in the semiconductor package 1000 according to the current example embodiment, the chip stack structure 200 may include first to fourth semiconductor chips 200-1 to 200-4 and the bonding pad 110 may include first to fourth bonding pads 110-1 to 110-4 to respectively correspond thereto. In addition, as illustrated in FIG. 1A, the plurality of first bonding pads 110-1, the plurality of second bonding pads 110-2, the plurality of third bonding pads 110-3, and the plurality of fourth bonding pads 110-4 may be arranged on the package substrate 100.

For example, the first bonding pad 110-1 may be connected to the first chip pad 210-1 of the first semiconductor chip 200-1 through the first wire 220-1. The second bonding pad 110-2 may be connected to the second chip pad 210-2 of the second semiconductor chip 200-2 through the second wire 220-2. The third bonding pad 110-3 may be connected to the third chip pad 210-3 of the third semiconductor chip 200-3 through the third wire 220-3. The fourth bonding pad 110-4 may be connected to the fourth chip pad 210-4 of the fourth semiconductor chip 200-4 through the fourth wire 220-4.

The first to fourth bonding pads 110-1 to 110-4 may be away from the chip stack structure 200 in a first direction (an x direction) in the order of the first bonding pad 110-1, the second bonding pad 110-2, the third bonding pad 110-3, and the fourth bonding pad 110-4. For example, the first bonding pad 110-1 may be closest to the chip stack structure 200 in the first direction (the x direction) and the fourth bonding pad 110-4 may be farthest from the chip stack structure 200 in the first direction (the x direction). Based on the arrangements of the first to fourth bonding pads 110-1 to 110-4, the first to fourth wires 220-1 to 220-4 connecting the first to fourth bonding pads 110-1 to 110-4 to the first to fourth chip pads 210-1 to 210-4 of the semiconductor chips, respectively, may be easily formed.

On the other hand, the first to fourth bonding pads 110-1 to 110-4 may be connected to one another through upper wiring lines 126. For example, the first to fourth bonding pads 110-1 to 110-4 arranged in the first direction (the x direction) may be connected to one another through the upper wiring lines 126. In addition, based on the first to fourth bonding pads 110-1 to 110-4 connected to one another, the same signal may be transmitted to the first to fourth chip pads 210-1 to 210-4 of the corresponding semiconductor chips.

The wiring line 120 may include an internal wiring line 122, a via contact 124, and the upper wiring lines 126. The internal wiring line 122 may be arranged in the package substrate 100 and may extend in parallel with the upper surface or a lower surface of the package substrate 100. In FIG. 1B, the internal wiring line 122 is arranged in the package substrate 100 as a single layer. However, the inventive concepts are not limited thereto. For example, the internal wiring line 122 having a multilayer structure of no less than two layers may be arranged in the package substrate 100. On the other hand, according to an example embodiment, the internal wiring line 122 may be omitted.

The via contact 124 may pass through at least a part of the package substrate 100 in a third direction (a z direction). Here, the via contact 124 may connect the layers of the internal wiring line 122 to one another. Further, the via contact 124 may connect the internal wiring line 122 to the first to fourth bonding pads 110-1 to 110-4, the upper wiring lines 126, and the external pad 130.

The upper wiring lines 126 may be arranged on the upper surface of the package substrate 100. As illustrated in FIGS. 1A and 1B, the upper wiring lines 126 may connect the first to fourth bonding pads 110-1 to 110-4 to one another. For example, the first to third bonding pads 110-1 to 110-3 may be connected to the fourth bonding pad 110-4 through the upper wiring lines 126. Further, the upper wiring lines 126 may include a portion extending from the fourth bonding pad 110-4 to the outside. The upper wiring lines 126 may be connected to the internal wiring line 122 through the via contact 124.

On the other hand, although not shown in FIGS. 1A and 1B, the wiring line 120 may further include a lower wiring line formed on the lower surface of the package substrate 100. The lower wiring line may be covered with the protective layer and may be connected to the external pad 130. Further, the lower wiring line may be connected to the internal wiring line 122 through the via contact 124.

The external pad 130 may be arranged on the lower surface of the package substrate 100. The external connection terminal 300 may be arranged on the external pad 130. In FIG. 1B, it is illustrated that one external pad 130 and one external connection terminal 300 are arranged for convenience sake. However, a plurality of external pads 130 and a plurality of external connection terminals 300 respectively corresponding thereto may be arranged on the lower surface of the package substrate 100 in a two-dimensional array structure.

On the other hand, the external connection terminal 300 may be connected to the fourth bonding pad 110-4 farthest from the chip stack structure 200 in the first direction (the x direction) through the external pad 130 and the wiring line 120 corresponding thereto. The semiconductor package 1000 according to the current example embodiment may improve signal integrity (SI) by reducing or minimizing signal reflection by maintaining wire length balance based on such a wiring connection structure. The improvement of the SI in accordance with the wire length balance is described in more detail below with reference to FIG. 10.

The chip stack structure 200 may be mounted on the package substrate 100 and may include the stacked first to fourth semiconductor chips 200-1 to 200-4. In the semiconductor package 1000 according to the current example embodiment, the chip stack structure 200 includes four semiconductor chips. However, the number of semiconductor chips of the chip stack structure 200 is not limited to 4. For example, the chip stack structure 200 may include two, three, or no less than five semiconductor chips.

The chip stack structure 200 may include the first to fourth semiconductor chips 200-1 to 200-4 sequentially stacked on the package substrate 100. The first semiconductor chip 200-1 may be attached and fixed onto the package substrate 100 through an adhesive layer 250. Further, each of the second to fourth semiconductor chips 200-2 to 200-4 may be attached and fixed onto a corresponding lower semiconductor chip. The first to fourth semiconductor chips 200-1 to 200-4 may have the same size and function. Therefore, hereinafter, description of the first semiconductor chip 200-1 is mainly given.

The first semiconductor chip 200-1 may be stacked on the package substrate 100 through the adhesive layer 250. The first semiconductor chip 200-1 may include a chip substrate and a device layer. The chip substrate may be based on a semiconductor material such as a silicon wafer. The device layer may be formed on the chip substrate and may include one of various kinds of devices. For example, the device layer may include one of various semiconductor devices such as a field effect transistor (FET) such as a planar FET or a FinFET, a memory device such as flash memory, dynamic random access memory (DRAM), static random access memory (SRAM), electrically erasable programmable read-only memory (EEPROM), phase-change random access memory (PRAM), magnetoresistive random access memory (MRAM), ferroelectric random access memory (FeRAM), resistive random access memory (RRAM), a logic device such as an AND logic, an OR logic, or a NOT logic, a system large scale integration (LSI) semiconductor chip, a CMOS imaging sensor (CIS), or a micro-electro-mechanical system (MEMS). For example, in the semiconductor package 1000 according to the current example embodiment, the first semiconductor chip 200-1 may be a DRAM chip including DRAM devices in a device layer. However, in the semiconductor package 1000 according to some example embodiments, the first semiconductor chip 200-1 is not limited to a DRAM chip.

The first semiconductor chip 200-1 may be mounted on the package substrate 100 through wire bonding. That is, the first chip pad 210-1 of the first semiconductor chip 200-1 may be electrically connected to the first bonding pad 110-1 of the package substrate 100 through the first wire 220-1. For reference, as the first semiconductor chip 200-1 is mounted on the package substrate 100 through wire bonding, the device layer of the first semiconductor chip 200-1 may face upward. That is, a front surface of the chip substrate on which the device layer is formed may face upward and a rear surface of the chip substrate may face the package substrate 100 and may be attached to the upper surface of the package substrate 100.

Although not shown in FIGS. 1A and 1B, the semiconductor package 1000 may include sealant covering a part of the upper surface of the package substrate 100, an upper surface and a side surface of the chip stack structure 200, and the first to fourth wires 220-1 to 220-4. The sealant with a predetermined thickness may cover the upper surface of the chip stack structure 200. However, according to an example embodiment, the sealant may not cover the upper surface of the chip stack structure 200 so that the upper surface of the chip stack structure 200 may be exposed from the sealant to the outside. The sealant may include, for example, epoxy mold compound (EMC). However, a material of the sealant is not limited to EMC.

The external connection terminal 300 may be arranged on the lower surface of the package substrate 100. The external connection terminal 300 may be electrically connected to the wiring line 120 of the package substrate 100 through the external pad 130. On the other hand, the external connection terminal 300 may include a solder ball. However, according to an example embodiment, the external connection terminal 300 may include a pillar or solder. The semiconductor package 1000 according to the current example embodiment may be mounted on an external substrate such as an interposer (not shown) or a base substrate (not shown) through the external connection terminal 300.

For reference, a bifurcation structure of a signal may affect SI more as a speed of a device increases. Therefore, in an unavoidable bifurcation structure, it may be important to maintain a condition from a bifurcation to a point at which the signal reaches to be similar. For example, in a memory semiconductor package including a stack structure of a plurality of semiconductor chips, due to heights of the plurality of semiconductor chips and positions of bonding pads, bifurcation conditions may not be similar. Further, SI may not significantly matter in an operation speed in units of MHzs. However, when the operation speed increases to several GHzs to dozens of GHzs, SI may significantly matter. Therefore, in an unavoidable bifurcation structure, it may be desired to improve or optimize a bifurcation.

In general, a package substrate, for example, a PCB of a semiconductor package connects an external connection terminal to a corresponding semiconductor chip through a bonding pad and a wire. In a memory semiconductor package in which capacity expansion is desired, the semiconductor chip is stacked on the PCB having a multilayer structure. At this time, a difference in wire connected from the semiconductor chip to the bonding pad may occur due to a height of the semiconductor chip and an arrangement position of the bonding pad. For example, a length of a wire of a semiconductor chip at the uppermost end is maximal and a length of a wire of a semiconductor chip at the lowermost end may be minimal. Because a wiring line of the PCB is commonly a shortest distance designed, although it depends on a structure, the external connection terminal is connected to a bonding pad connected to the lowermost semiconductor chip through the wiring line of the PCB. When the bonding pad is used as a bifurcation, a significant difference in channel length occurs between the uppermost semiconductor chip and the lowermost semiconductor chip based on the bifurcation, which cause channel reflection so that electrical characteristics, for example, SI may deteriorate.

However, in the semiconductor package 1000 according to the current example embodiment, by connecting the external connection terminal 300 to the fourth bonding pad 110-4 through the wiring line 120 using the fourth bonding pad 110-4 farthest from the chip stack structure 200 as a bifurcation, SI may be improved or prevented from deteriorating due to the above-described difference in channel length. Hereinafter, referring to FIG. 10, in the semiconductor package 1000 according to the current example embodiment, SI improvement is described in more detail.

Referring to FIG. 10, as described above, in the semiconductor package 1000 according to the current example embodiment, the external connection terminal 300 may be connected to the fourth bonding pad 110-4 through the wiring line 120. The first to fourth semiconductor chips 200-1 to 200-4 of the chip stack structure 200 may be connected to the first to fourth bonding pads 110-1 to 110-4 through the first to fourth wires 220-1 to 220-4. In addition, the first to third bonding pads 110-1 to 110-3 may be connected to the fourth bonding pad 110-4 through the upper wiring lines 126.

A distance from the external connection terminal 300 to the fourth bonding pad 110-4 as the bifurcation may have a common distance Dc. Further, as marked with dashed lines, a first length D1 from the first semiconductor chip 200-1 to the fourth bonding pad 110-4 may include a length of the first wire 220-1 and lengths of the three upper wiring lines 126. In addition, a second length D2 from the fourth semiconductor chip 200-4 to the fourth bonding pad 110-4 may include a length of the fourth wire 220-4. The first length D1 and the second length D2 may balance to some degree in terms of a signal transmission function. For example, the first length D1 may be equal to the second length D2 within an identity range of about ±20%. The identity range of the first length D1 and the second length D2 is not limited to the above numerical range. For example, the identity range of the first length D1 and the second length D2 may be defined to be different from the above-described numerical range in terms of the signal transmission function.

On the other hand, a channel length to the first semiconductor chip 200-1, which is seen from the external connection terminal 300, may correspond to the sum of the common length Dc and the first length D1 and a channel length to the fourth semiconductor chip 200-4, which is seen from the external connection terminal 300, may correspond to the sum of the common length Dc and the second length D2. As described above, because the first length D1, which is a sum of a length of the first wire 220-1 and a length of the upper wiring line 126 between the first bonding pad 110-1 and the fourth bonding pad 110-4, is equal or comparable to the second length D2, a channel length from the external connection terminal 300 to the first semiconductor chip 200-1 and a channel length from the external connection terminal 300 to the fourth semiconductor chip 200-4 may be in balance with each other. Further, because the common length Dc is common to the first semiconductor chip 200-1 and the fourth semiconductor chip 200-4, the channel lengths to the first semiconductor chip 200-1 and the fourth semiconductor chip 200-4, which are seen from the fourth bonding pad 110-4 as the bifurcation, may be balanced.

Although not shown in FIG. 10, the same concepts may also be applied to a channel length to the second semiconductor chip 200-2 and a channel length to the third semiconductor chip 200-3, which are seen from the external connection terminal 300 or the bifurcation. As a result, in the semiconductor package 1000 according to the current example embodiment, channel lengths to the first to fourth semiconductor chips 200-1 to 200-4, which are seen from the external connection terminal 300 or the bifurcation, may be balanced so that SI may be remarkably improved.

On the other hand, the above-described concepts may be applied when the external connection terminal 300 and the first to fourth bonding pads 110-1 to 110-4 are arranged in opposite directions based on the chip stack structure 200. That is, as illustrated in FIG. 1B, when the external connection terminal 300 is arranged on the left of the chip stack structure 200 and the first to fourth bonding pads 110-1 to 110-4 are arranged on the right of the chip stack structure 200 in the first direction (the x direction), the fourth bonding pad 110-4 farthest from the chip stack structure 200 becomes the bifurcation and the external connection terminal 300 is connected to the fourth bonding pad 110-4 through the wiring line 120 so that the channel lengths to the first to fourth semiconductor chips 200-1 to 200-4 may be balanced.

However, when the external connection terminal 300 and the first to fourth bonding pads 110-1 to 110-4 are arranged in the same direction based on the chip stack structure 200, based on a shortest distance design, the fourth bonding pad 110-4 farthest from the chip stack structure 200 becomes the bifurcation and the external connection terminal 300 is connected to the fourth bonding pad 110-4 through the wiring line 120, and thus it is not desired to change a conventional shortest distance design method.

Furthermore, in the semiconductor package 1000 according to the current example embodiment, the external connection terminal 300 to which the above-described inventive concepts are applied and the first to fourth bonding pads 110-1 to 110-4 and the first to fourth wires 220-1 to 220-4 connected thereto may correspond to signal lines. Here, the signal lines may include data signal lines DQ and command/address signal lines C/A. On the other hand, because a ground/power line has nothing to do with SI, previous inventive concepts may not be applied thereto.

FIGS. 2A to 2D are cross-sectional views of semiconductor packages 1000a to 1000d according to some example embodiments of the inventive concepts. Description previously given with reference to FIGS. 1A to 1C is briefly given or omitted.

Figure 2A:
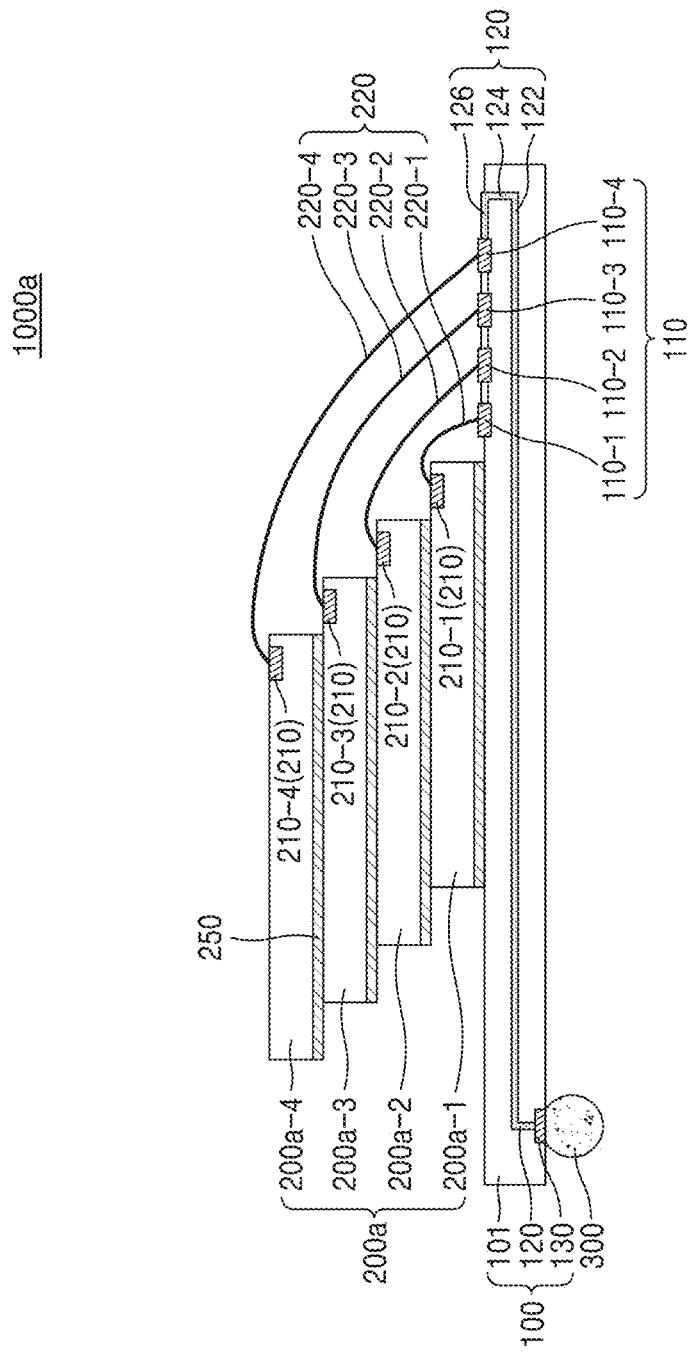
FIGS. 2A to 2D are cross-sectional views of semiconductor packages having balanced wiring structures according to some example embodiments of the inventive concepts.

Referring to FIG. 2A, the semiconductor package 1000a according to an example embodiment may be different from the semiconductor package 1000 of FIG. 1B in a structure of a chip stack structure 200a. Describing in more detail, in the semiconductor package 1000 of FIG. 1B, the first to fourth semiconductor chips 200-1 to 200-4 of the chip stack structure 200 may have the same size and may be stacked so that sides of the first to fourth semiconductor chips 200-1 to 200-4 of the chip stack structure 200 coincide with one another. On the other hand, in the semiconductor package 1000a according to the current example embodiment, the first to fourth semiconductor chips 200a-1 to 200a-4 of the chip stack structure 200a may have the same size but may be stacked in a step structure. As the first to fourth semiconductor chips 200a-1 to 200a-4 are stacked in a step structure, first to fourth chip pads 210-1 to 210-4 of the first to fourth semiconductor chips 200a-1 to 200a-4 may be exposed upward.

On the other hand, in the semiconductor package 1000a according to the current example embodiment, as the first to fourth chip pads 210-1 to 210-4 of the first to fourth semiconductor chips 200a-1 to 200a-4 are exposed upward, the first to fourth chip pads 210-1 to 210-4 may be more easily connected to first to fourth wires 220-1 to 220-4. In addition, because intervals among the first to fourth semiconductor chips 200a-1 to 200a-4 for connecting the first to fourth chip pads 210-1 to 210-4 to the first to fourth wires 220-1 to 220-4 are not needed, an entire height of the semiconductor package 1000a may be reduced.

Furthermore, according to some example embodiments, semiconductor chips of the chip stack structure 200a are stacked so that the sides of the semiconductor chips are stepped, and sides of lower semiconductor chips and sides of upper semiconductor chips may be stepped in opposite directions. For example, when the chip stack structure 200a includes six semiconductor chips, the first to fourth semiconductor chips may be stacked so that sides of the first to fourth semiconductor chips are stepped on the left and the fourth to sixth semiconductor chips may be stacked so that sides of the fourth to sixth semiconductor chips are stepped on the right. In such a structure, a chip pad may be exposed on the left in the fourth semiconductor chip in the middle.

In the semiconductor package 1000a according to the current example embodiment, an external connection terminal 300 may be connected to a fourth bonding pad 110-4 corresponding to a bifurcation through a wiring line 120. Therefore, in the semiconductor package 1000a according to the current example embodiment, channel lengths to the first to fourth semiconductor chips 200a-1 to 200a-4, which are seen from the external connection terminal 300 or the bifurcation, may be balanced, and thus SI may be improved.

Figure 2B:
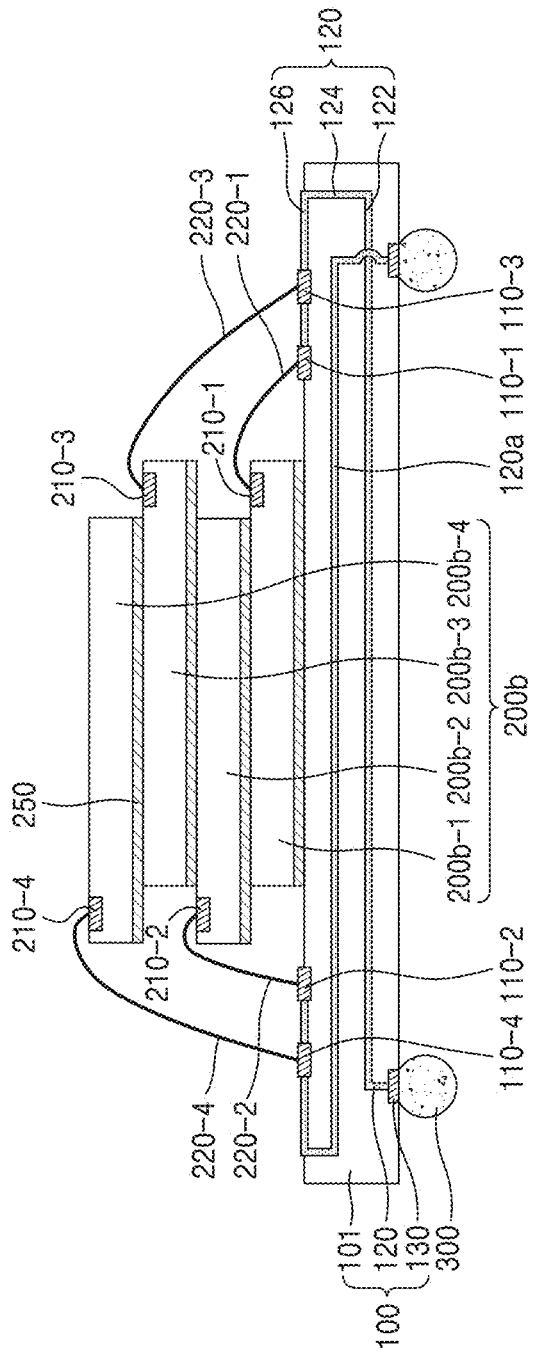

Referring to FIG. 2B, the semiconductor package 1000b according to an example embodiment may be different from the semiconductor package 1000 of FIG. 1B in a structure of a chip stack structure 200b and wire bonding. For example, in the semiconductor package 1000b according to the current example embodiment, first to fourth semiconductor chips 200b-1 to 200b-4 of the chip stack structure 200b may have the same size and may be stacked in zigzags. Further, in the first and third semiconductor chips 200b-1 and 200b-3 among the first to fourth semiconductor chips 200b-1 to 200b-4, first and third chip pads 210-1 and 210-3 may be arranged on the right in the first direction (the x direction) and, in the second and fourth semiconductor chips 200b-2 and 200b-4 among the first to fourth semiconductor chips 200b-1 to 200b-4, second and fourth chip pads 210-2 and 210-4 may be arranged on the left in the first direction (the x direction).

To correspond to positions of the first to fourth chip pads 210-1 to 210-4 of the first to fourth semiconductor chips 200b-1 to 200b-4, first and third bonding pads 110-1 and 110-3 may be arranged on the right of a package substrate 100 and second and fourth bonding pads 110-2 and 110-4 may be arranged on the left of the package substrate 100. Further, the first and third chip pads 210-1 and 210-3 of the first and third semiconductor chips 200b-1 and 200b-3 may be connected to the first and third bonding pads 110-1 and 110-3 through first and third wires 220-1 and 220-3 and the second and fourth chip pads 210-2 and 210-4 of the second and fourth semiconductor chips 200b-2 and 200b-4 may be connected to the second and fourth bonding pads 110-2 and 110-4 through second and fourth wires 220-2 and 220-4.

On the other hand, the first and third bonding pads 110-1 and 110-3 may be connected to each other through an upper wiring line 126 and the third bonding pad 110-3 may be connected to an external connection terminal 300 arranged on the left through a first wiring line 120. Here, the third bonding pad 110-3 may correspond to a bifurcation. Further, the second and fourth bonding pads 110-2 and 110-4 may be connected to each other through the upper wiring line 126 and the fourth bonding pad 110-4 may be connected to an external connection terminal 300 arranged on the right through a second wiring line 120a. Here, the fourth bonding pad 110-4 may correspond to a bifurcation. As a result, in the semiconductor package 1000b according to the current example embodiment, channel lengths to the first to fourth semiconductor chips 200b-1 to 200b-4, which are seen from the external connection terminals 300 or the bifurcation, may be balanced, and thus SI may be improved.

Figure 2C:
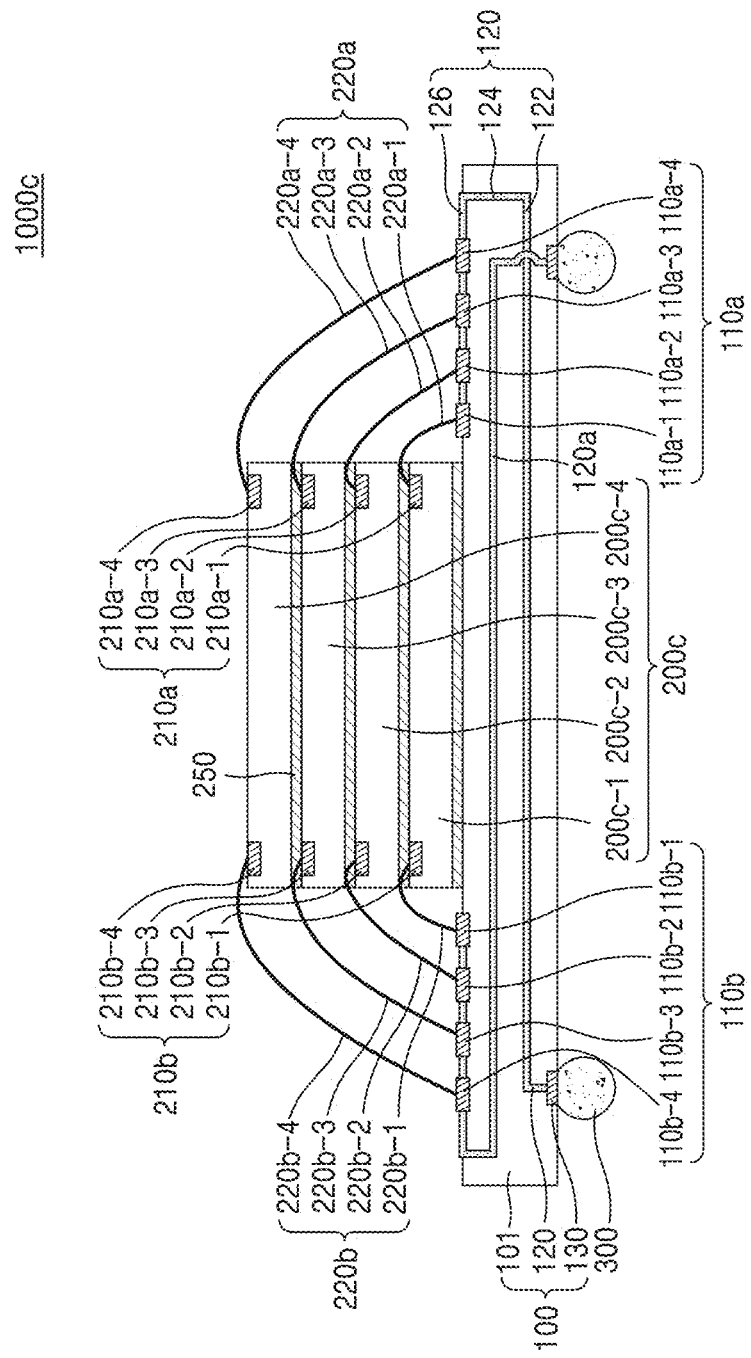

Referring to FIG. 2C, the semiconductor package 1000c according to an example embodiment may be different from the semiconductor package 1000 of FIG. 1B in a structure of a chip stack structure 200c and wire bonding. For example, in the semiconductor package 1000c according to the current example embodiment, first to fourth semiconductor chips 200c-1 to 200c-4 of the chip stack structure 200c may have the same size and may be stacked so that sides of the first to fourth semiconductor chips 200c-1 to 200c-4 coincide one another. However, each of the first to fourth semiconductor chips 200c-1 to 200c-4 may include first to fourth right chip pads 210a-1 to 210a-4 on one side and first to fourth left chip pads 210b-1 to 210b-4 on another side in the first direction (the x direction).

To correspond to positions of the first to fourth right and left chip pads 210a-1 to 210a-4 and 210b-1 to 210b-4 of each of the first to fourth semiconductor chips 200c-1 to 200c-4, first to fourth right and left bonding pads 110a-1 to 110a-4 and 110b-1 to 110b-4 may be arranged on corresponding sides of a package substrate 100. Further, the first to fourth right chip pads 210a-1 to 210a-4 of each of the first to fourth semiconductor chips 200c-1 to 200c-4 may be connected to the first to fourth right bonding pads 110a-1 to 110a-4 of the package substrate 100 through first to fourth right wires 220a-1 to 220a-4 and the first to fourth left chip pads 210b-1 to 210b-4 of each of the first to fourth semiconductor chips 200c-1 to 200c-4 may be connected to the first to fourth left bonding pads 110b-1 to 110b-4 of the package substrate 100 through first to fourth left wires 220b-1 to 220b-4.

On the other hand, the first to fourth right bonding pads 110a-1 to 110a-4 of the package substrate 100 may be connected to one another through an upper wiring line 126 and the fourth right bonding pad 110a-4 may be connected to an external connection terminal 300 arranged on the left through a first wiring line 120. Here, the fourth right bonding pad 110a-4 may correspond to a bifurcation. Further, the first to fourth left bonding pads 110b-1 to 110b-4 of the package substrate 100 may be connected to one another through the upper wiring line 126 and the fourth left bonding pad 110b-4 may be connected to an external connection terminal 300 arranged on the right through a second wiring line 120a. Here, the fourth left bonding pad 110b-4 may correspond to a bifurcation. As a result, in the semiconductor package 1000c according to the current example embodiment, channel lengths to the first to fourth semiconductor chips 200c-1 to 200c-4, which are seen from the external connection terminals 300 or the bifurcation, may be balances, and thus SI may be improved.

Figure 2D:
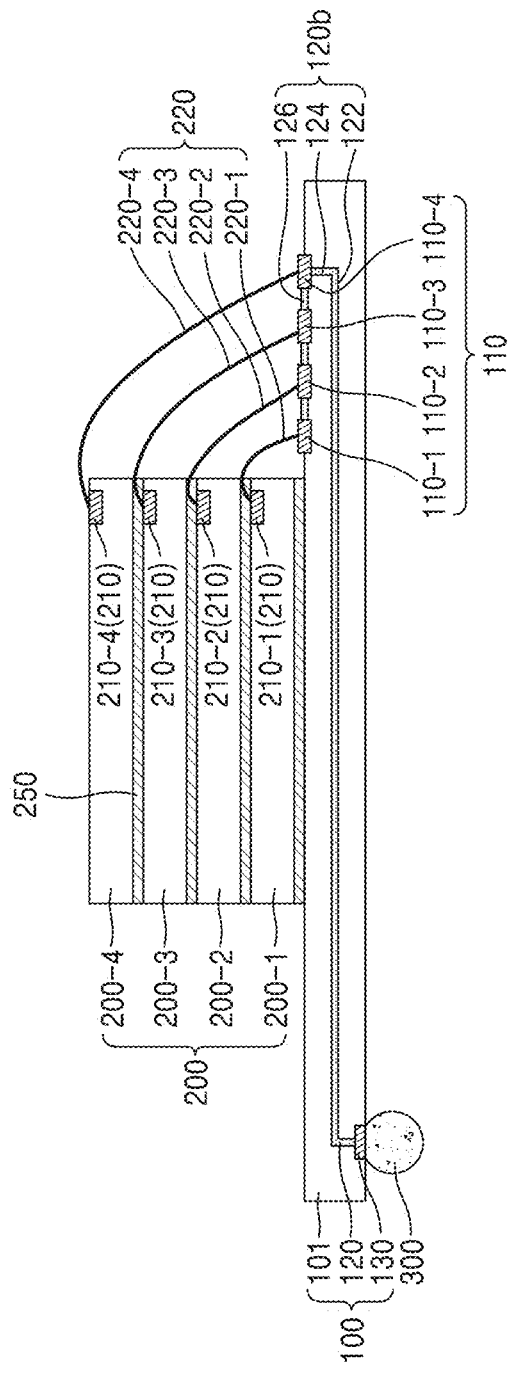

Referring to FIG. 2D, the semiconductor package 1000d according to an example embodiment may be different from the semiconductor package 1000 of FIG. 1B in a structure of a second wiring line 120b of a package substrate 100. For example, in the semiconductor package 1000d according to the current example embodiment, the second wiring line 120b of the package substrate 100 may include an upper wiring line 126 extending from first to fourth bonding pads 110-1 to 110-4 and the upper wiring line 126 may not include a portion extending from the fourth bonding pad 110-4 to the outside. Due to such a structure of the upper-wiring line 126, the fourth bonding pad 110-4 may be directly connected to an internal wiring line 122 through a via contact 124.

Figure 3A:
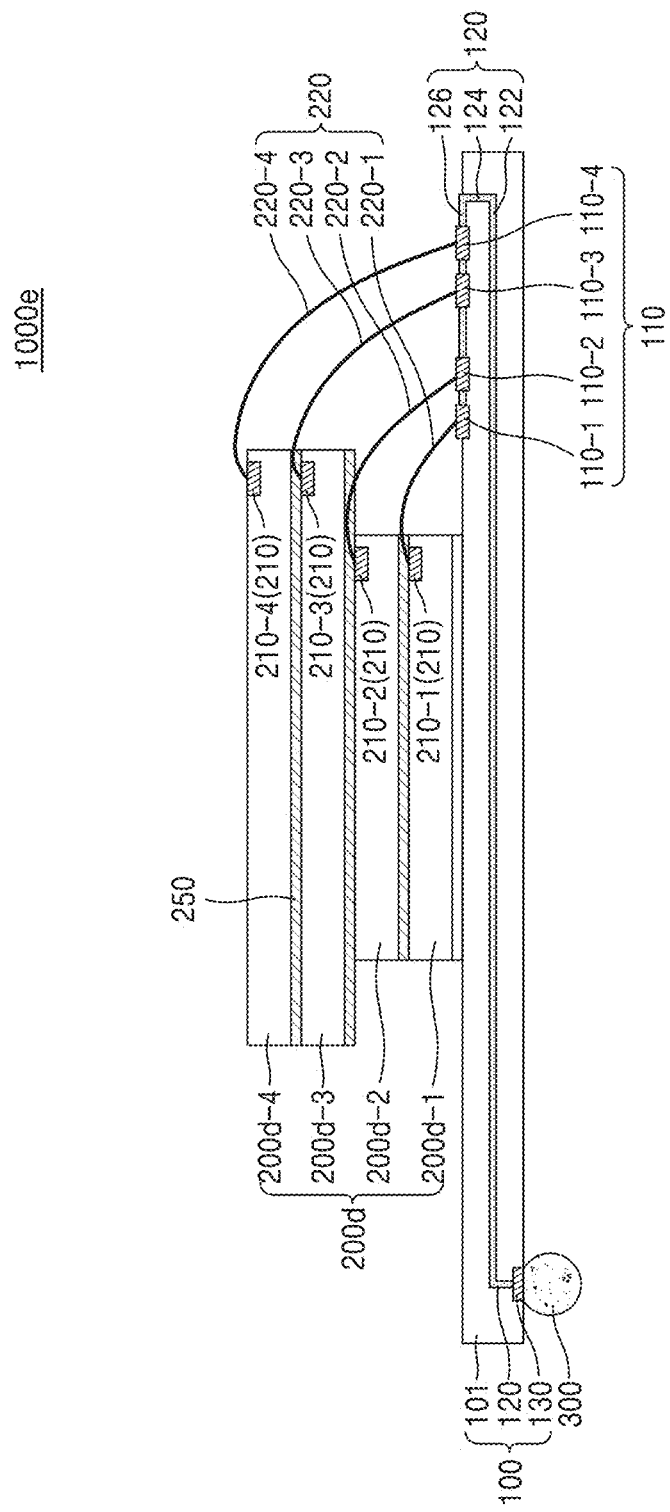
FIGS. 3A and 3B are cross-sectional views of semiconductor packages having balanced wiring structures according to some example embodiments of the inventive concepts.
Figure 3B:
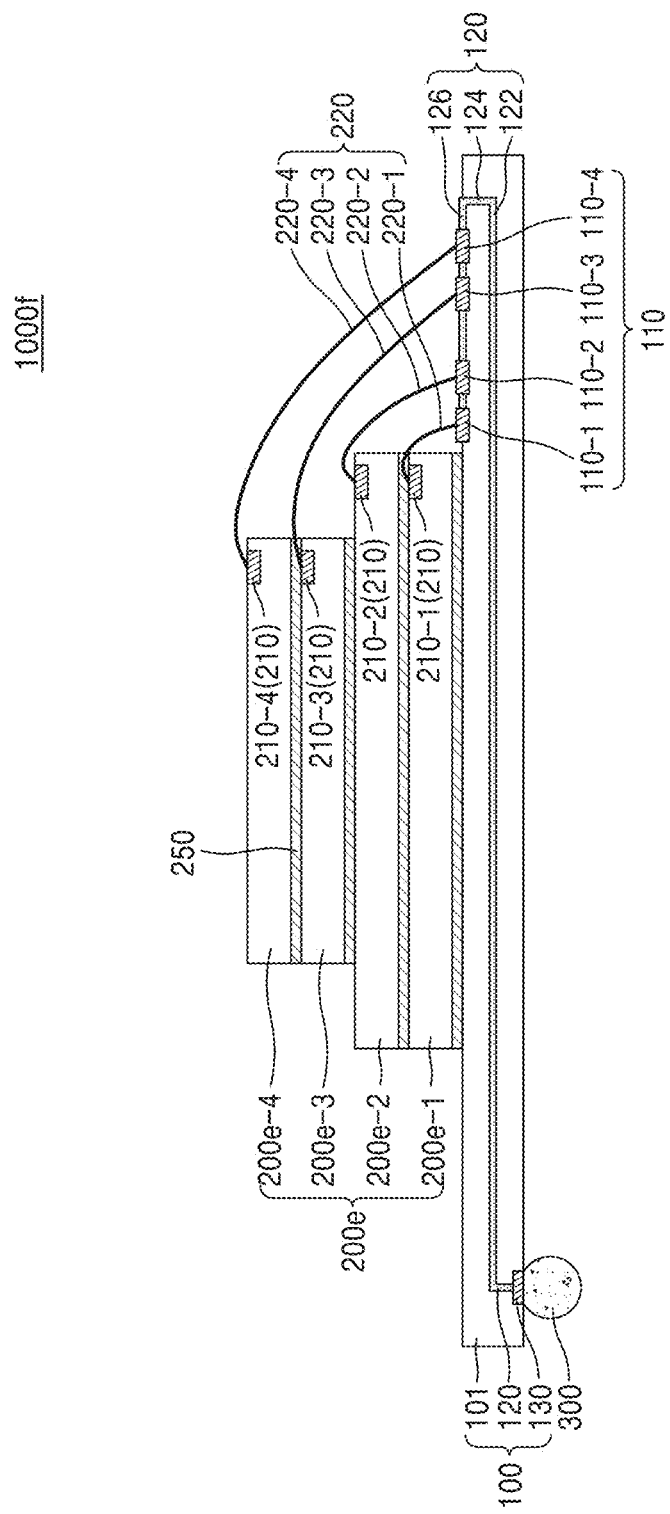

FIGS. 3A and 3B are cross-sectional views of semiconductor packages 1000e and 1000f according to some example embodiments of the inventive concepts. Description previously given with reference to FIGS. 1A to 2D is briefly given or omitted.

Referring to FIG. 3A, the semiconductor package 1000e according to an example embodiment may be different from the semiconductor package 1000 of FIG. 1B in a structure of a chip stack structure 200d. Describing in more detail, in the semiconductor package 1000 of FIG. 1B, the first to fourth semiconductor chips 200-1 to 200-4 of the chip stack structure 200 may have the same size and may be stacked so that sides of the first to fourth semiconductor chips 200-1 to 200-4 of the chip stack structure 200 coincide with one another. On the contrary, in the semiconductor package 1000e according to the current example embodiment, at least one of first to fourth semiconductor chips 200d-1 to 200d-4 of the chip stack structure 200d may have a size different from sizes of the others. For example, the first and second semiconductor chips 200d-1 and 200d-2 may be smaller than the third and fourth semiconductor chips 200d-3 and 200d-4. Therefore, the chip stack structure 200d may have a structure in which the third and fourth semiconductor chips 200d-3 and 200d-4 are stacked on the first and second semiconductor chips 200d-1 and 200d-2.

Arrangement positions of first to fourth bonding pads 110-1 to 110-4 of a package substrate 100, a connection structure between the first to fourth bonding pads 110-1 to 110-4 and first to fourth wires 220-1 to 220-4, and a connection structure between an external connection terminal 300 and the fourth bonding pad 110-4 through a wiring line 120 are the same as described with reference to the semiconductor package 1000 of FIG. 1B. Therefore, in the semiconductor package 1000e according to the current example embodiment, channel lengths to the first to fourth semiconductor chips 200d-1 to 200d-4, which are seen from the external connection terminal 300 or a bifurcation, may be balanced, and thus SI may be improved.

Referring to FIG. 3B, the semiconductor package 1000f according to an example embodiment may be different from the semiconductor package 1000e of FIG. 3A in a structure of a chip stack structure 200e. Describing in more detail, in the semiconductor package 1000f according to the current example embodiment, at least one of first to fourth semiconductor chips 200e-1 to 200e-4 of the chip stack structure 200e may have a size different from sizes of the others. For example, the first and second semiconductor chips 200e-1 and 200e-2 may be larger than the third and fourth semiconductor chips 200e-3 and 200e-4. Therefore, the chip stack structure 200e may have a structure in which the third and fourth semiconductor chips 200e-3 and 200e-4 are stacked on the first and second semiconductor chips 200e-1 and 200e-2.

Arrangement positions of first to fourth bonding pads 110-1 to 110-4 of a package substrate 100, a connection structure between the first to fourth bonding pads 110-1 to 110-4 and first to fourth wires 220-1 to 220-4, and a connection structure between an external connection terminal 300 and the fourth bonding pad 110-4 through a wiring line 120 are the same as described with reference to the semiconductor package 1000 of FIG. 1B. Therefore, in the semiconductor package 1000f according to the current example embodiment, channel lengths to the first to fourth semiconductor chips 200e-1 to 200e-4, which are seen from the external connection terminal 300 or a bifurcation, may be balanced, and thus SI may be improved.

Figure 4A:
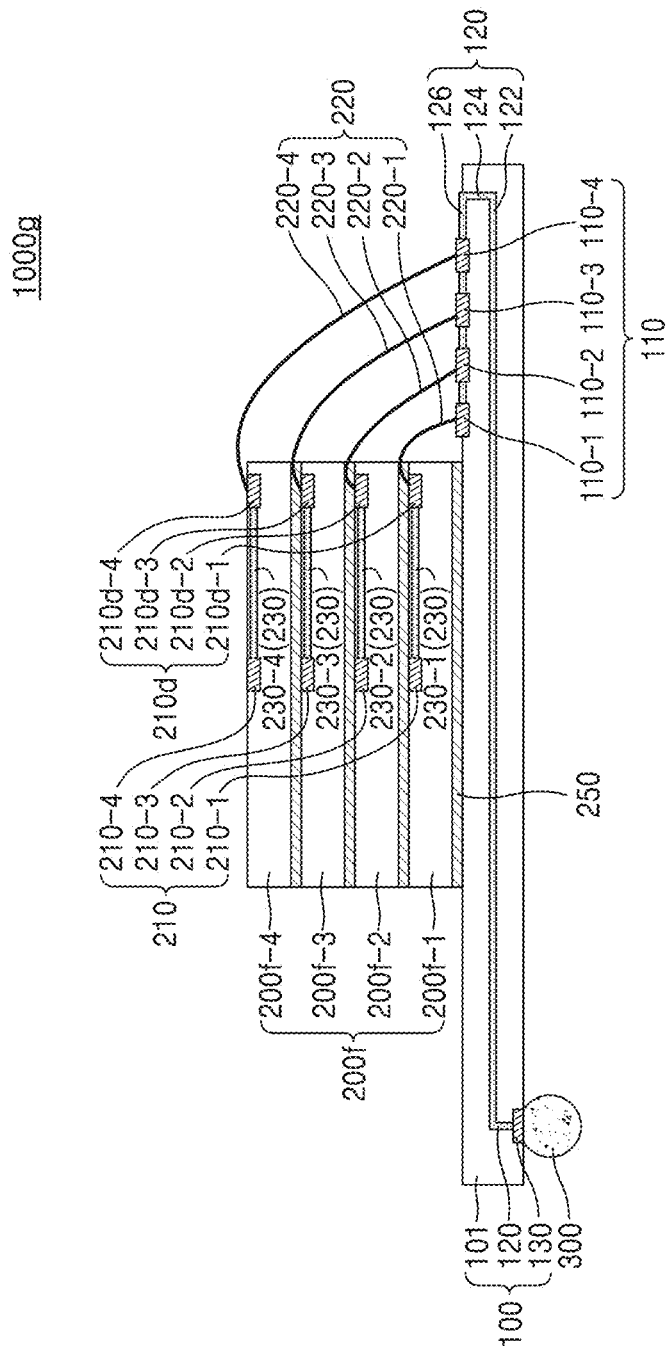
FIGS. 4A to 4C are cross-sectional views of semiconductor packages having balanced wiring structures according to some example embodiments of the inventive concepts.
Figure 4B:
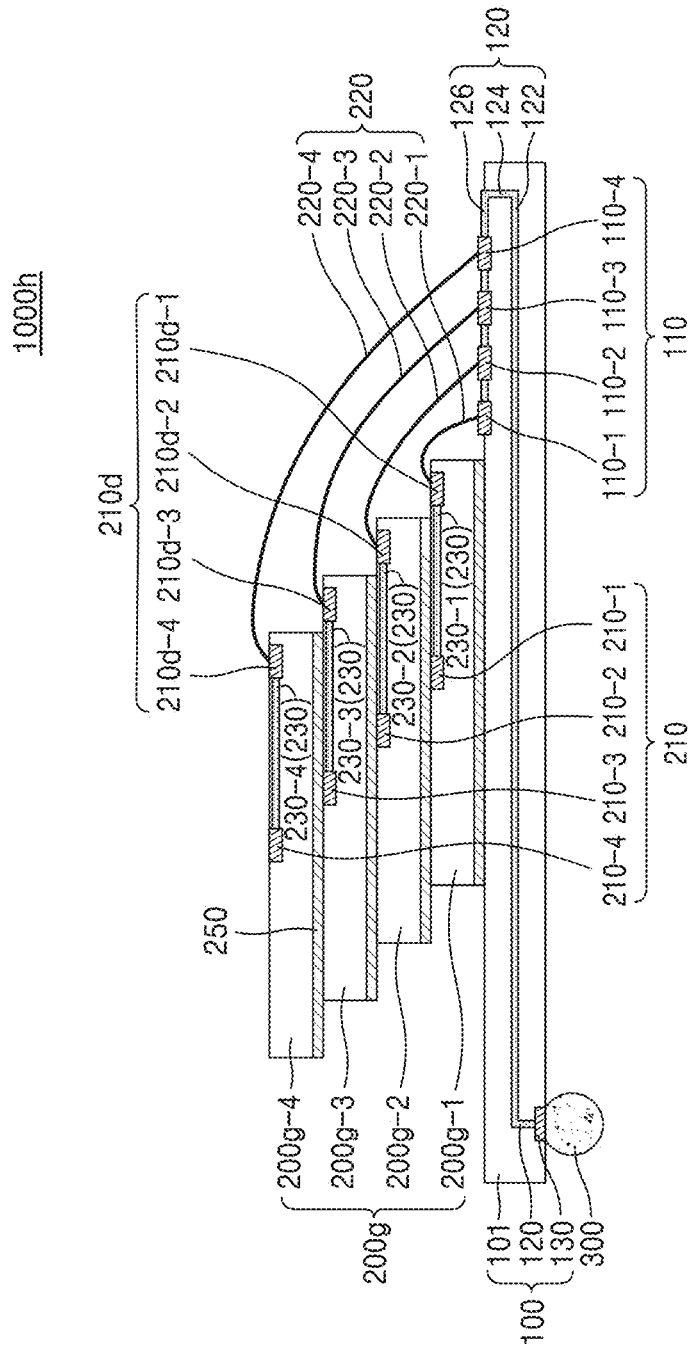
Figure 4C:
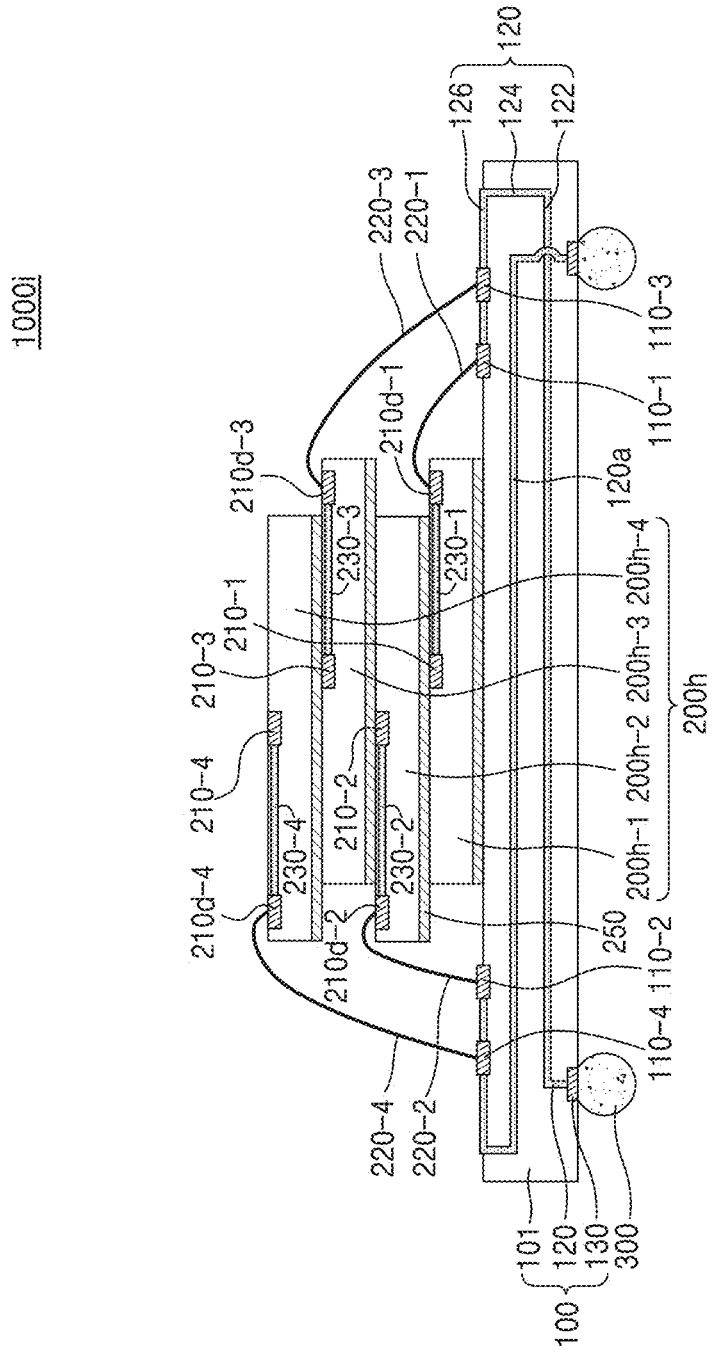

FIGS. 4A to 4C are cross-sectional views of semiconductor packages 1000g to 1000i according to some example embodiments of the inventive concepts. Description previously given with reference to FIGS. 1A to 3B is briefly given or omitted.

Referring to FIG. 4A, the semiconductor package 1000g according to an example embodiment may be different from the semiconductor package 1000 of FIG. 1B in structures of first to fourth semiconductor chips 200f-1 to 200f-4 of a chip stack structure 200f. Describing in more detail, in the semiconductor package 1000g according to the current example embodiment, first to fourth chip pads 210-1 to 210-4 may be respectively arranged in the centers of the first to fourth semiconductor chips 200f-1 to 200f-4 of the chip stack structure 200f in the first direction (the x direction). Further, the first to fourth semiconductor chips 200f-1 to 200f-4 may include first to fourth connection pads 210d-1 to 210d-4 respectively arranged on the right with respect to corresponding ones of the first to fourth chip pads 210-1 to 210-4 in the first direction (the x direction) and first to fourth rewiring lines 230-1 to 230-4 respectively connecting the first to fourth chip pads 210-1 to 210-4 to the first to fourth connection pads 210d-1 to 210d-4.

Here, each of the first to fourth chip pads 210-1 to 210-4 means a real pad connected to devices of a device layer in each of the first to fourth semiconductor chips 200f-1 to 200f-4 and the first to fourth connection pads 210d-1 to 210d-4 connected to first to fourth wires 220-1 to 220-4 are referred to as rewiring pads.

On the other hand, in the semiconductor package 1000g according to the current example embodiment, the first to fourth connection pads 210d-1 to 210d-4 may be connected to first to fourth bonding pads 110-1 to 110-4 through the first to fourth wires 220-1 to 220-4. In general, a channel length to each of the first to fourth semiconductor chips 200f-1 to 200f-4 may be calculated as a path from an external connection terminal 300 or a bifurcation to each of the first to fourth semiconductor chips 200f-1 to 200f-4. However, as noted from FIG. 4A, the first to fourth rewiring lines 230-1 to 230-4 may have the same length. Therefore, in the semiconductor package 1000g according to the current example embodiment, channel lengths to the first to fourth semiconductor chips 200f-1 to 200f-4, which are seen from the external connection terminal 300 or the bifurcation, may be balanced, and thus SI may be improved.

Referring to FIG. 4B, the semiconductor package 1000h according to an example embodiment may have a structure as a combination of the semiconductor package 1000a of FIG. 2A with the semiconductor package 1000g of FIG. 4A. For example, in the semiconductor package 1000h according to the current example embodiment, first to fourth semiconductor chips 200g-1 to 200g-4 of a chip stack structure 200g may be stacked so that sides of the first to fourth semiconductor chips 200g-1 to 200g-4 of the chip stack structure 200g are stepped. Further, first to fourth chip pads 210-1 to 210-4 may be respectively arranged in the centers of the first to fourth semiconductor chips 200g-1 to 200g-4 of the chip stack structure 200g, which include first to fourth connection pads 210d-1 to 210d-4 respectively arranged on the right with respect to corresponding ones of the first to fourth chip pads 210-1 to 210-4 of the first to fourth semiconductor chips 200g-1 to 200g-4 and first to fourth rewiring lines 230-1 to 230-4 respectively connecting the first to fourth chip pads 210-1 to 210-4 to the first to fourth connection pads 210d-1 to 210d-4. Content other than the above is the same as described with reference to FIGS. 2A and 4A. Therefore, in the semiconductor package 1000h according to the current example embodiment, channel lengths to the first to fourth semiconductor chips 200g-1 to 200g-4, which are seen from an external connection terminal 300 or a bifurcation, may be balanced, and thus SI may be improved.

Referring to FIG. 4C, the semiconductor package 1000i according to an example embodiment may have a structure as a combination of the semiconductor package 1000b of FIG. 2B with the semiconductor package 1000g of FIG. 4A. For example, in the semiconductor package 1000i according to the current example embodiment, first to fourth semiconductor chips 200h-1 to 200h-4 of a chip stack structure 200h may be stacked in zigzags. Further, first to fourth chip pads 210-1 to 210-4 may be respectively arranged in the centers of the first to fourth semiconductor chips 200h-1 to 200h-4 of the chip stack structure 200h, which include first to fourth connection pads 210d-1 to 210d-4 arranged on the left with respect to the first to fourth chip pads 210-1 to 210-4 of the first to fourth semiconductor chips 200h-1 to 200h-4 and first to fourth rewiring lines 230-1 to 230-4 respectively connecting the first to fourth chip pads 210-1 to 210-4 to the first to fourth connection pads 210d-1 to 210d-4.

On the other hand, in the semiconductor package 1000i according to the current example embodiment, the first and third connection pads 210d-1 and 210d-3 of the first and third semiconductor chips 200h-1 and 200h-3 may be respectively arranged on the right with respect to corresponding ones of the first and third chip pads 210-1 and 210-3 in the first direction (the x direction) and the second and fourth connection pads 210d-2 and 210d-4 of the second and fourth semiconductor chips 200h-2 and 200h-4 may be arranged on the left with respect to the second and fourth chip pads 210-2 and 210-4 in the first direction (the x direction). Therefore, the first and third rewiring lines 230-1 and 230-3 may extend from the center to the right and the second and fourth rewiring lines 230-2 and 230-4 may extend from the center to the left. Content other than the above is the same as described with reference to FIGS. 2B and 4A. Therefore, in the semiconductor package 1000i according to the current example embodiment, channel lengths to the first to fourth semiconductor chips 200h-1 to 200h-4, which are seen from external connection terminals 300 or a bifurcation, may be balanced, and thus SI may be improved.

Figure 5A:
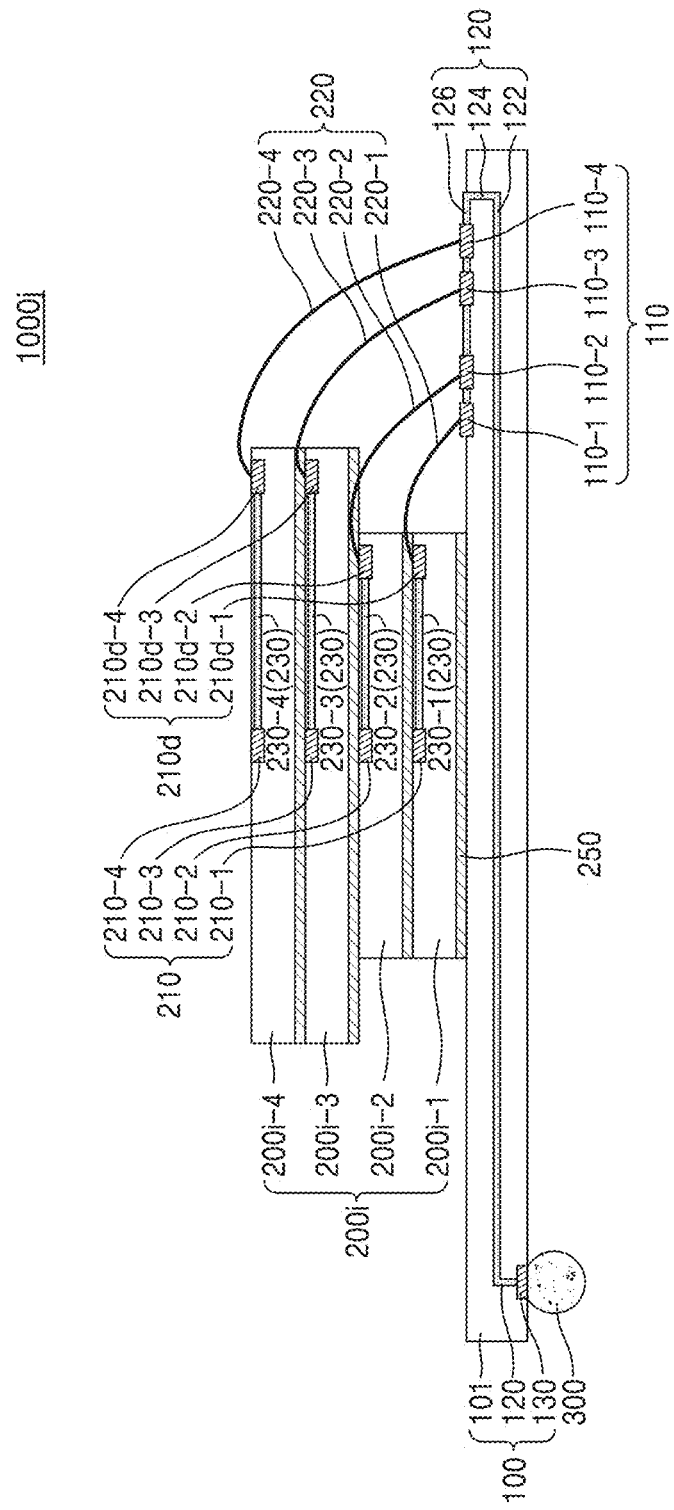
FIGS. 5A and 5B are cross-sectional views of semiconductor packages having balanced wiring structures according to some example embodiments of the inventive concepts.
Figure 5B:
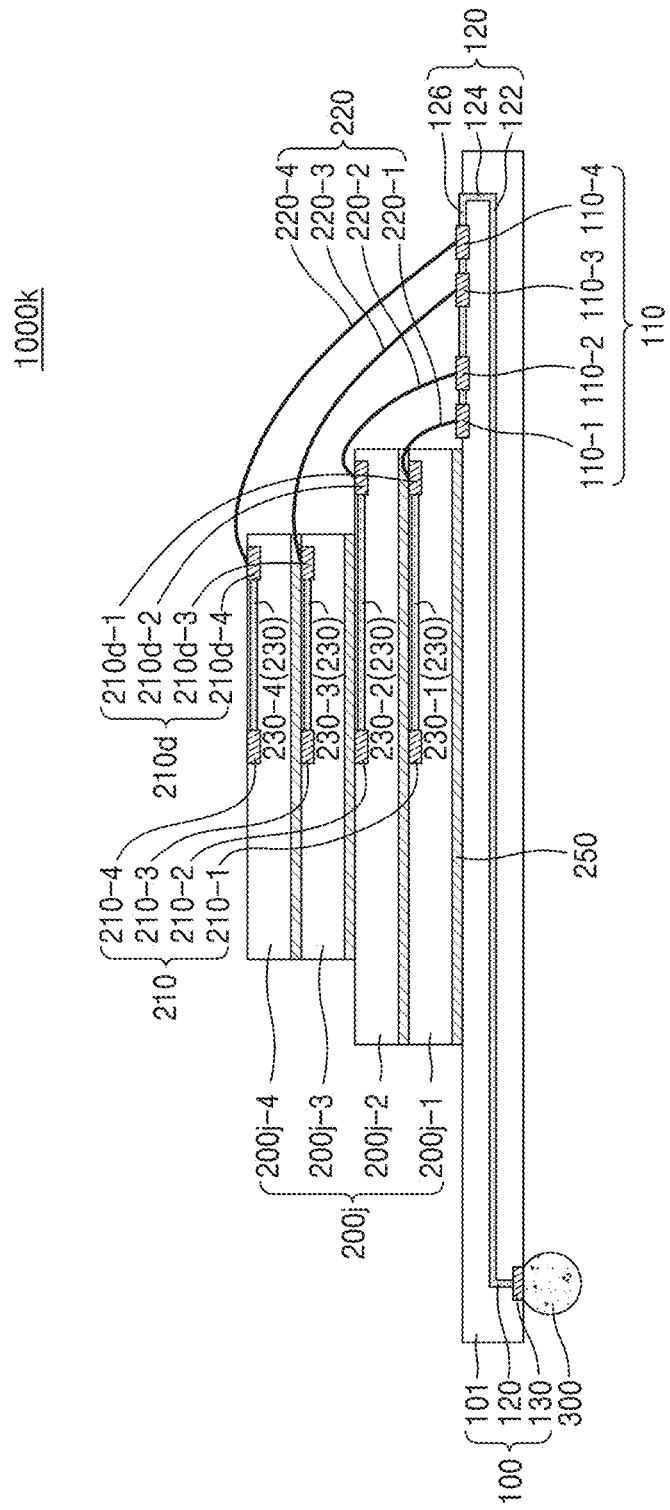

FIGS. 5A and 5B are cross-sectional views of semiconductor packages 1000j and 1000k according to some example embodiments of the inventive concepts. Description previously given with reference to FIGS. 1A to 4C is briefly given or omitted.

Referring to FIG. 5A, the semiconductor package 1000j according to an example embodiment may have a structure as a combination of the semiconductor package 1000e of FIG. 3A with the semiconductor package 1000g of FIG. 4A. For example, in the semiconductor package 1000j according to the current example embodiment, at least one of first to fourth semiconductor chips 200i-1 to 200i-4 of a chip stack structure 200i may have a size different from sizes of the others. For example, the first and second semiconductor chips 200i-1 and 200i-2 may be smaller than the third and fourth semiconductor chips 200i-3 and 200i-4. Further, first to fourth chip pads 210-1 to 210-4 may be respectively arranged in the centers of the first to fourth semiconductor chips 200i-1 to 200i-4 of the chip stack structure 200i. The first to fourth semiconductor chips 200i-1 to 200i-4 of the chip stack structure 200i respectively include first to fourth connection pads 210d-1 to 210d-4 that are respectively arranged on the right with respect to corresponding ones of the first to fourth chip pads 210-1 to 210-4 of the first to fourth semiconductor chips 200i-1 to 200i-4 and first to fourth rewiring lines 230-1 to 230-4 respectively connecting the first to fourth chip pads 210-1 to 210-4 to the first to fourth connection pads 210d-1 to 210d-4. Content other than the above is the same as described with reference to FIGS. 3A and 4A. Therefore, in the semiconductor package 1000j according to the current example embodiment, channel lengths to the first to fourth semiconductor chips 200i-1 to 200i-4, which are seen from an external connection terminal 300 or a bifurcation, balance so that SI may be improved.

Furthermore, in the semiconductor package 1000j according to the current example embodiment, because lengths of the first and second rewiring lines 230-1 and 230-2 are different from those of the third and fourth rewiring lines 230-3 and 230-4, the SI in accordance with the balance of the channel lengths to the first to fourth semiconductor chips 200i-1 to 200i-4, which are seen from the external connection terminal 300 or the bifurcation, may be remarkably improved. For example, in a chip stack structure including a rewiring line in which a valid length of a channel increases, because a level of signal reflection increases in proportion to a bifurcated channel length, in the semiconductor package 1000j according to the current example embodiment with a compensation structure (e.g., the rewiring line 230) of a channel length on a semiconductor chip, SI may be remarkably improved.

Referring to FIG. 5B, the semiconductor package 1000k according to an example embodiment may have a structure as a combination of the semiconductor package 1000f of FIG. 3B with the semiconductor package 1000g of FIG. 4A. For example, in the semiconductor package 1000k according to the current example embodiment, at least one of first to fourth semiconductor chips 200j-1 to 200j-4 of a chip stack structure 200j may have a size different from sizes of the others. For example, the first and second semiconductor chips 200j-1 and 200j-2 may be larger than the third and fourth semiconductor chips 200j-3 and 200j-4. Further, first to fourth chip pads 210-1 to 210-4 may be respectively arranged in the centers of the first to fourth semiconductor chips 200j-1 to 200j-4 of the chip stack structure 200j. The first to fourth semiconductor chips 200*j*-1 to 200*j*-4 may respectively include first to fourth connection pads 210*d*-1 to 210*d*-4 respectively arranged on the right with respect to corresponding the first to fourth chip pads 210-1 to 210-4 of the first to fourth semiconductor chips 200*j*-1 to 200*j*-4 and first to fourth rewiring lines 230-1 to 230-4 respectively connecting the first to fourth chip pads 210-1 to 210-4 to the first to fourth connection pads 210*d*-1 to 210*d*-4. Content other than the above is the same as described with reference to FIGS. 3B, 4A, and 5A. Therefore, in the semiconductor package 1000*k* according to the current example embodiment, channel lengths to the first to fourth semiconductor chips 200*j*-1 to 200*j*-4, which are seen from an external connection terminal 300 or a bifurcation, may be balanced, and thus SI may be improved.

Figure 6A:
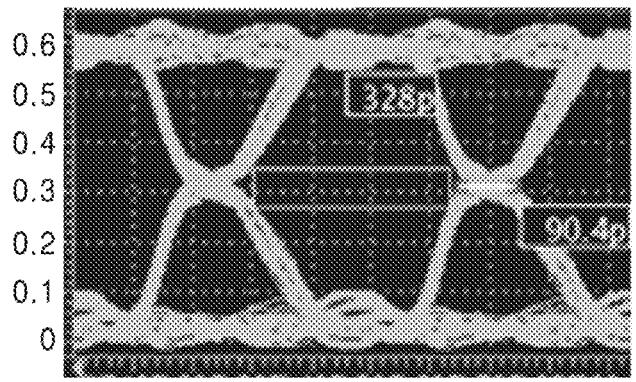
FIGS. 6A to 6C are simulation photographs and a graph comparing signal integrity (SI) of a conventional semiconductor package with SI of a semiconductor package according to an example embodiment.
Figure 6B:
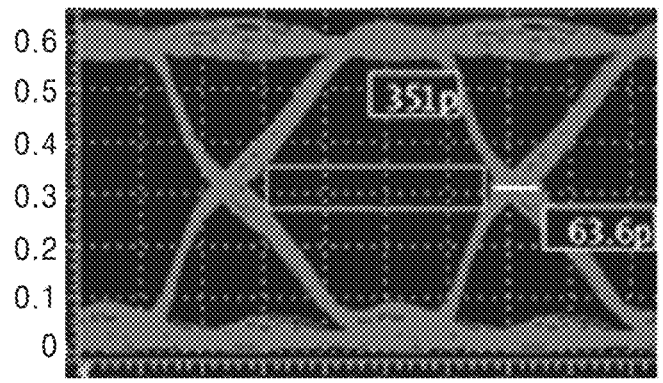
Figure 6C:
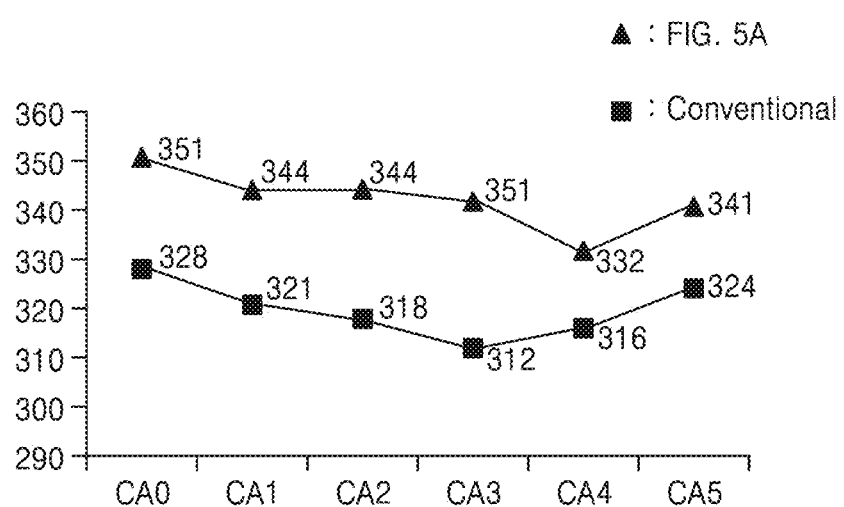

FIGS. 6A to 6C are simulation photographs and a graph comparing SI of a conventional semiconductor package with SI of a semiconductor package according to an example embodiment. In the simulation photographs of FIGS. 6A and 6B, an x axis represents picoseconds ps as time and a y axis represents amplitude in arbitrary units. In the graph of FIG. 6C, an x axis represents a kind of a signal and a y axis represents eye open in units of picoseconds.

Referring to FIGS. 6A and 6B, FIG. 6A is the simulation photograph of the conventional semiconductor package, that is, a semiconductor package in which a wiring line of a package substrate is shortest distance designed and FIG. 6B is the simulation photograph of the semiconductor package 1000*j* of FIG. 5A, that is, a semiconductor package in which the wiring line of the package substrate 100 is designed to have a balanced wiring structure. On the other hand, the chip stack structure of the conventional semiconductor package may have not have a balanced wiring structure as that of the chip stack structure 200*i* of the semiconductor package 1000*j* of FIG. 5A.

As noted from the simulation photograph of FIG. 6A, in the conventional semiconductor package, due to knee phenomenon caused by signal reflection, eye open has a small value of 328 ps and eye jitter or timing jitter has a large value of 90.4 ps. For reference, the eye open means time interval capable of sampling a received signal. As the eye open is greater, SI is evaluated as being high. When noise is received, the eye open is reduced. In addition, the eye jitter is obtained by measuring a width of a portion in which rise and fall of a waveform crosses, that is, a knee portion. As the eye jitter is less, the SI may be evaluated as being high.

On the other hand, as noted from the simulation photograph of FIG. 6B, in the semiconductor package 1000*j* of FIG. 5A, the eye open remarkably increases to about 351 ps and the eye jitter is remarkably reduced to 63.6 ps. Therefore, it may be noted that the SI of the semiconductor package 1000*j* of FIG. 5A remarkably improves in comparison with that of the conventional semiconductor package.

Referring to FIG. 6C, in the conventional semiconductor package and the semiconductor package 1000*j* of FIG. 5A, SI characteristics of six signals, for example, six command/address signals CA0 to CA5 are illustrated. As noted from the graph of FIG. 6C, for all the command/address signals CA0 to CA5, eye open values ▲ of the semiconductor package 1000*j* of FIG. 5A are greater than eye open values ■ of the conventional semiconductor package. Therefore, it may be noted that the SI of the semiconductor package 1000*j* of FIG. 5A is remarkably improved in comparison with that of the conventional semiconductor package.

Figure 7A:
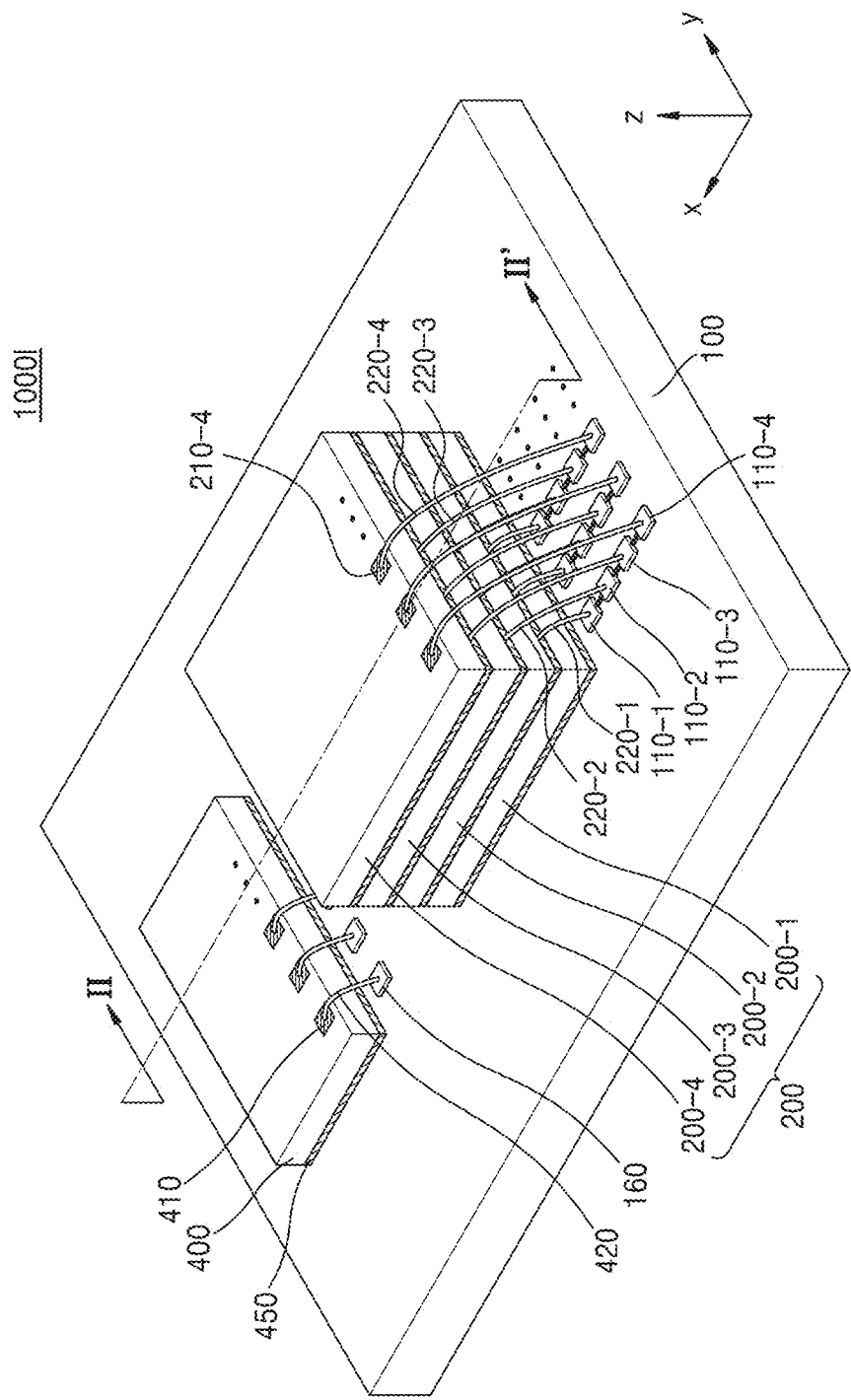
FIGS. 7A and 7B are a perspective view and a cross-sectional view of a semiconductor package having a balanced wiring structure according to an example embodiment of the inventive concepts.
Figure 7B:
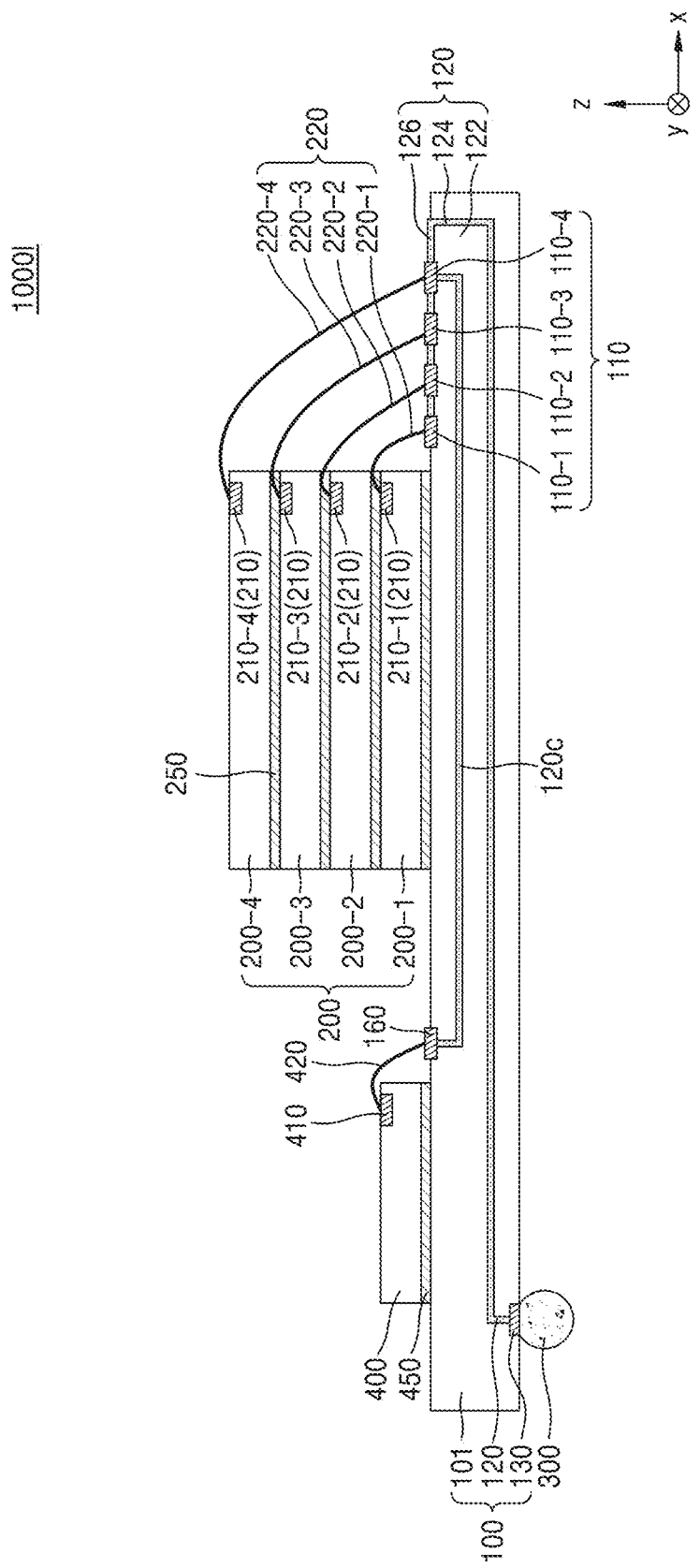

FIGS. 7A and 7B are a perspective view and a cross-sectional view of a semiconductor package 10001 according to an example embodiment of the inventive concepts. Description previously given with reference to FIGS. 1A to 5B is briefly given or omitted.

Referring to FIGS. 7A and 7B, the semiconductor package 10001 according to the current example embodiment may be different from the semiconductor package 1000 of FIG. 1A in that the semiconductor package 10001 further includes an internal semiconductor chip 400. For example, the semiconductor package 10001 according to the current example embodiment may include a package substrate 100, a chip stack structure 200, an external connection terminal 300, and the internal semiconductor chip 400. The package substrate 100, the chip stack structure 200, and the external connection terminal 300 are the same as described with reference to the semiconductor package 1000 of FIG. 1A.

The internal semiconductor chip 400 may be apart from the chip stack structure 200 and may be mounted on the package substrate 100. The internal semiconductor chip 400 may be a memory chip including a memory device in a device layer or a logic chip including a logic device in a device layer. When the internal semiconductor chip 400 is the memory chip, the internal semiconductor chip 400 may be a memory chip of a kind different from first to fourth semiconductor chips 200-1 to 200-4 of the chip stack structure 200. On the other hand, when the internal semiconductor chip 400 is the logic chip, the internal semiconductor chip 400 may be, for example, a control chip controlling the first to fourth semiconductor chips 200-1 to 200-4 of the chip stack structure 200. However, the kind of the internal semiconductor chip 400 is not limited to the above-described semiconductor chips.

In the semiconductor package 10001 according to the current example embodiment, the internal semiconductor chip 400 may be attached and fixed onto the package substrate 100 through an adhesive layer 450. Further, the internal semiconductor chip 400 may be arranged on the left of the chip stack structure 200 in the first direction (the x direction). However, an arrangement position of the internal semiconductor chip 400 is not limited thereto. For example, the internal semiconductor chip 400 may be arranged on one side or either side of the chip stack structure 200 in a second direction (a y direction). Due to a wire bonding structure of the chip stack structure 200, the internal semiconductor chip 400 may not be arranged on the right of the chip stack structure 200 in the first direction (the x direction).

On the other hand, in the semiconductor package 10001 according to the current example embodiment, the internal semiconductor chip 400 is mounted on the package substrate 100 in a single chip structure. However, a structure of the internal semiconductor chip 400 is not limited to the single chip structure. For example, the internal semiconductor chip 400 may have a structure of a chip stack structure including a plurality of semiconductor chips and may be mounted on the package substrate 100.

The internal semiconductor chip 400 may be mounted on the package substrate 100 through wire bonding. That is, a chip pad 410 of the internal semiconductor chip 400 may be electrically connected to a signal pad 160 of the package substrate 100 through a wire 420. On the other hand, the signal pad 160 may be connected to a fourth bonding pad 110-4 through a third wiring line 120*c* of the package substrate 100.

In the semiconductor package 10001 according to the current example embodiment, as the signal pad 160 is connected to the fourth bonding pad 110-4, channel lengths to the first to fourth semiconductor chips 200-1 to 200-4 of the chip stack structure 200, which are seen from the signal pad 160, may be balanced. As a result, SI of the semiconductor package 10001 according to the current example embodiment may be improved. For reference, when the third wiring line 120*c* is shortest distance designed, the signal pad 160 may be connected to a first bonding pad 110-1 through the third wiring line 120*c* and the channel lengths to the first to fourth semiconductor chips 200-1 to 200-4 of the chip stack structure 200, which are seen from the signal pad 160, may be remarkably different from one another so that the SI may deteriorate. However, in the semiconductor package 10001 according to the current example embodiment, the signal pad 160 is connected to the fourth bonding pad 110-4 through the third wiring line 120*c* so that the SI may be mitigated or prevented from deteriorating.

Figure 8:
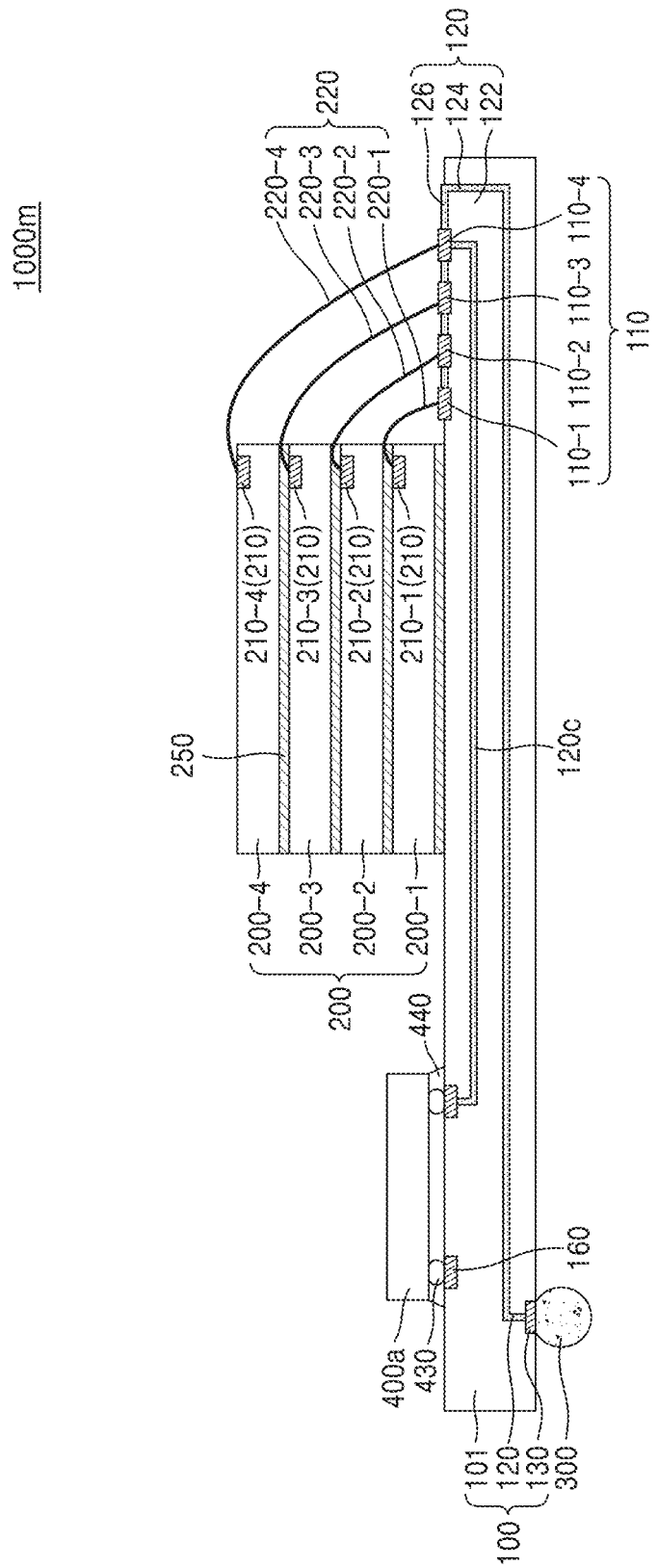
FIG. 8 is a cross-sectional view of a semiconductor package having a balanced wiring structure according to an example embodiment of the inventive concepts.

FIG. 8 is a cross-sectional view of a semiconductor package 1000*m* according to an example embodiment of the inventive concepts. Description previously given with reference to FIGS. 7A and 7B is briefly given or omitted.

Referring to FIG. 8, the semiconductor package 1000*m* according to an example embodiment may be different from the semiconductor package 10001 of FIG. 7B in that an internal semiconductor chip 400*a* is mounted on a package substrate 100 through flip-chip bonding. For example, in the semiconductor package 1000*m* according to the current example embodiment, the internal semiconductor chip 400*a* may be mounted on the package substrate 100 through bumps 430. The bumps 430 may electrically connect chip pads 410 of the internal semiconductor chip 400*a* to signal pads 160 of the package substrate 100. As noted from FIG. 8, the internal semiconductor chip 400*a* may be stacked on the package substrate 100 so that a front surface of a chip substrate on which a device layer is formed faces the package substrate 100. On the other hand, an underfill 440 may be arranged between the internal semiconductor chip 400*a* and the package substrate 100.

In the semiconductor package 1000*m* according to the current example embodiment, one of the signal pads 160 may be connected to a fourth bonding pad 110-4 through a third wiring line 120*c*. Therefore, channel lengths to first to fourth semiconductor chips 200-1 to 200-4 of a chip stack structure 200, which are seen from the signal pads 160, may be balanced. As a result, SI of the semiconductor package 1000*m* according to the current example embodiment may be improved.

Furthermore, in terms of balance of the channel lengths to the first to fourth semiconductor chips 200-1 to 200-4 of the chip stack structure 200, an arrangement position of each of the internal semiconductor chips 400 and 400*a* and a connection relationship of the third wiring line 120*c* may be generalized as follows. Each of the internal semiconductor chips 400 and 400*a* may be arranged in a portion in which the first to fourth bonding pads 110-1 to 110-4 are not arranged based on the chip stack structure 200, for example, on at least one of on the left of the chip stack structure 200 in the first direction (the x direction) and on either side of the chip stack structure 200 in the second direction (the y direction). In addition, the signal pad 160 connected to the chip pad 410 of each of the internal semiconductor chips 400 and 400*a* may be connected to the fourth bonding pad 110-4 through the third wiring line 120*c*.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
a package substrate;
a chip stack structure on an upper surface of the package substrate, the chip stack structure including at least two semiconductor chips; and
an external connection terminal on a lower surface of the package substrate,
wherein the at least two semiconductor chips include a first semiconductor chip and a second semiconductor chip,
the first semiconductor chip is an uppermost one from among the at least two semiconductor chips and is connected to a first bonding pad of the package substrate through a first wire,
the second semiconductor chip is under the first semiconductor chip from among the at least two semiconductor chips and is connected to a second bonding pad of the package substrate through a second wire,
the first bonding pad is connected to the second bonding pad through an upper wiring line on the package substrate,
the upper wiring line horizontally extends on the package substrate and includes a first portion and a second portion, the first portion extending from the first bonding pad in a direction away from the at least two semiconductor chips, the second portion horizontally extending between the first bonding pad and the second bonding pad,
the first bonding pad is farther from the external connection terminal than the second bonding pad,
the external connection terminal is connected to the first bonding pad through a wiring line of the package substrate and is connected to the second bonding pad through the wiring line, the first bonding pad, and the upper wiring line,
the first wire, the first bonding pad, the first portion of the upper wiring line, and the wiring line are sequentially connected, and
a length of the second portion of the upper wiring line is proportional to a difference between a length of the first wire and a length of the second wire.

2. The semiconductor package of claim 1, wherein
when viewed from the external connection terminal, a sum of a length of the second wire and a length of the upper wiring line between the second bonding pad and the first bonding pad is equal or comparable to a length of the first wire.

3. The semiconductor package of claim 2, wherein
at least one of the at least two semiconductor chips includes a chip pad, a connection pad connected to a wire that is connected to a bonding pad of the package substrate, and a rewiring line connecting the chip pad to the connection pad.

4. The semiconductor package of claim 1, wherein
the chip stack structure comprises four semiconductor chips,
the second semiconductor chip is a lowermost semiconductor chip,
a third semiconductor chip is on the second semiconductor chip and is connected to a third bonding pad of the package substrate through a third wire,
a fourth semiconductor chip is on the third semiconductor chip and is connected to a fourth bonding pad of the package substrate through a fourth wire, lengths of first to fourth wires are shorter in an order of the first wire, the fourth wire, the third wire, and the second wire, first to fourth bonding pads are farther from the chip stack structure in an order of the second bonding pad, the third bonding pad, the fourth bonding pad, and the first bonding pad, the third and fourth bonding pads are connected to the first bonding pad through an upper wiring line, and each of a sum of a length of the third wire and a length of the upper wiring line between the first bonding pad and the third bonding pad and a sum of a length of the fourth wire and a length of the upper wiring line between the first bonding pad and the fourth bonding pad is equal or comparable to a length of the first wire.

5. The semiconductor package of claim 1, wherein
the at least two semiconductor chips have a same size, and
the chip stack structure has one of
  a first structure in which the at least two semiconductor chips are stacked so that sides of the at least two semiconductor chips coincide with one another,
  a second structure in which the at least two semiconductor chips are stacked so that the sides of the at least two semiconductor chips are stepped, or
  a third structure in which the at least two semiconductor chips are stacked in zigzags.

6. The semiconductor package of claim 1, wherein
at least one of the at least two semiconductor chips has a size different from sizes of the others of the at least two semiconductor chips, and
the chip stack structure has one of
  a first structure in which the second semiconductor chip is on a bottom and the first semiconductor chip is on a top, the first semiconductor chip being larger than the second semiconductor chip, or
  a second structure in which the second semiconductor chip is on a bottom and the first semiconductor chip is on a top, the second semiconductor chip being larger than the first semiconductor chip.

7. The semiconductor package of claim 1, wherein
the first semiconductor chip is connected to the first bonding pad on each of opposite sides of the package substrate in a first direction through the first wire on a corresponding one of the opposite sides in the first direction,
the second semiconductor chip is connected to the second bonding pad on each of the opposite sides of the package substrate in the first direction through the second wire on a corresponding one of the opposite sides in the first direction,
the second bonding pad is connected to the first bonding pad through the upper wiring line on the package substrate, and
the external connection terminal is on an opposite side to the first bonding pad with respect to the chip stack structure.

8. The semiconductor package of claim 1, further comprising:
at least one internal semiconductor chip apart from the chip stack structure and mounted on the package substrate,
wherein the internal semiconductor chip is connected to a signal pad of the package substrate through a wire or a bump,
the first bonding pad is farther from the signal pad than the second bonding pad, and
the signal pad is connected to the first bonding pad through a wiring line of the package substrate.

9. The semiconductor package of claim 1, wherein
the wiring line connects the first bonding pad to an external pad having the external connection terminal thereon, and
the wiring line comprises an internal wiring line and a via contact.

10. The semiconductor package of claim 1, wherein the external connection terminal and the first bonding pad connected thereto are configured to transmit a data signal or a command signal.

11. A semiconductor package comprising:
a package substrate;
a chip stack structure on the package substrate and including at least two semiconductor chips; and
at least one internal semiconductor chip apart from the chip stack structure and being on the package substrate,
wherein the at least two semiconductor chips include a first semiconductor chip and a second semiconductor chip,
the first semiconductor chip is an uppermost one from among the at least two semiconductor chips and is connected to a first bonding pad of the package substrate through a first wire,
the second semiconductor chip is under the first semiconductor chip from among the at least two semiconductor chips and is connected to a second bonding pad of the package substrate through a second wire,
the internal semiconductor chip is connected to a signal pad of the package substrate through a wire or a bump,
the first bonding pad is connected to the second bonding pad through an upper wiring line on the package substrate,
the upper wiring line horizontally extends on the package substrate and includes a first portion and a second portion, the first portion extending from the first bonding pad in a direction away from the at least two semiconductor chips, the second portion horizontally extending between the first bonding pad and the second bonding pad,
the first bonding pad is farther from the signal pad than the second bonding pad,
the signal pad is connected to the first bonding pad through a wiring line of the package substrate and is connected to the second bonding pad through the wiring line, the first bonding pad, and the upper wiring line,
the first wire, the first bonding pad, the first portion of the upper wiring line, and the wiring line are sequentially connected, and
a length of the second portion of the upper wiring line is proportional to a difference between a length of the first wire and a length of the second wire.

12. The semiconductor package of claim 11, wherein
when viewed from the signal pad, a sum of a length of the second wire and a length of the upper wiring line between the first bonding pad and the second bonding pad is equal or comparable to a length of the first wire.

13. The semiconductor package of claim 12, wherein
at least one of the at least two semiconductor chips includes a chip pad, a connection pad connected to a wire that is connected to a bonding pad of the package substrate, and a rewiring line connecting the chip pad to the connection pad.

14. The semiconductor package of claim 11, further comprising:
- an external connection terminal on a lower surface of the package substrate,
- wherein the first bonding pad is farther from the external connection terminal than the second bonding pad,
- the external connection terminal is connected to the first bonding pad through a wiring line of the package substrate,
- the second bonding pad is connected to the first bonding pad through the upper wiring line on the package substrate, the upper wiring line being parallel to the package substrate, and
- when viewed from the external connection terminal, a sum of a length of the second wire and a length of the upper wiring line between the first bonding pad and the second bonding pad is equal or comparable to a length of the first wire.

15. The semiconductor package of claim 11, wherein the signal pad and the first bonding pad connected thereto are configured to transmit a data signal or a command signal.

16. A semiconductor package comprising:
- a package substrate;
- a chip stack structure on the package substrate and including at least two semiconductor chips;
- at least one internal semiconductor chip apart from the chip stack structure and being on the package substrate; and
- an external connection terminal on a lower surface of the package substrate,
- wherein the at least two semiconductor chips include a first semiconductor chip and a second semiconductor chip,
- the first semiconductor chip is an uppermost one from among the at least two semiconductor chips and is connected to a first bonding pad of the package substrate through a first wire,
- the second semiconductor chip is under the first semiconductor chip from among the at least two semiconductor chips and is connected to a second bonding pad of the package substrate through a second wire,
- the first bonding pad is connected to the second bonding pad through an upper wiring line on the package substrate,
- the upper wiring line horizontally extends on the package substrate and includes a first portion and a second portion, the first portion extending from the first bonding pad in a direction away from the at least two semiconductor chips, the second portion horizontally extending between the first bonding pad and the second bonding pad,
- the first bonding pad is farther from the external connection terminal than the second bonding pad,
- the external connection terminal is connected to the first bonding pad through a wiring line of the package substrate and is connected to the second bonding pad through the wiring line, the first bonding pad, and the upper wiring line,
- the first wire, the first bonding pad, the first portion of the upper wiring line, and the wiring line are sequentially connected, and
- a length of the second portion of the upper wiring line is proportional to a difference between a length of the first wire and a length of the second wire.

17. The semiconductor package of claim 16, wherein
- when viewed from the external connection terminal, a sum of a length of the second wire and a length of the upper wiring line between the first bonding pad and the second bonding pad is equal or comparable to a length of the first wire.

18. The semiconductor package of claim 17, wherein
- at least one of the at least two semiconductor chips includes a chip pad, a connection pad connected to a wire that is connected to a bonding pad of the package substrate, and a rewiring line connecting the chip pad to the connection pad.

19. The semiconductor package of claim 16, wherein
- the at least one internal semiconductor chip is connected to a signal pad of the package substrate through a wire or a bump,
- the first bonding pad is farther from the signal pad than the second bonding pad,
- the signal pad is connected to the first bonding pad through a wiring line of the package substrate,
- the second bonding pad is connected to the first bonding pad through the upper wiring line on the package substrate, and
- when viewed from the signal pad, a sum of a length of the second wire and a length of the upper wiring line between the first bonding pad and the second bonding pad is equal or comparable to a length of the first wire.

20. The semiconductor package of claim 16, wherein the chip stack structure has one of
- a first structure in which the at least two semiconductor chips have a same size and are stacked so that sides of the at least two semiconductor chips coincide with one another,
- a second structure in which the at least two semiconductor chips are stacked so that the sides of the at least two semiconductor chips are stepped,
- a third structure in which the at least two semiconductor chips are stacked in zigzags,
- a fourth structure in which the second semiconductor chip is on a bottom, and the first semiconductor chip is on a top, the first semiconductor chip being larger than the second semiconductor chip, or
- a fifth structure in which the second semiconductor chip is on a bottom and the first semiconductor chip is on a top, the second semiconductor chip being larger than the first semiconductor chip.

* * * * *